(12) United States Patent
Ha et al.

(10) Patent No.: US 12,543,301 B2
(45) Date of Patent: Feb. 3, 2026

(54) SEMICONDUCTOR DEVICE

(71) Applicant: Samsung Electronics Co., Ltd., Suwon-si (KR)

(72) Inventors: Daewon Ha, Seoul (KR); Mingyu Kim, Suwon-si (KR); Doyoung Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 350 days.

(21) Appl. No.: 17/719,723

(22) Filed: Apr. 13, 2022

(65) Prior Publication Data

US 2023/0052477 A1 Feb. 16, 2023

(30) Foreign Application Priority Data

Aug. 13, 2021 (KR) .................. 10-2021-0107381

(51) Int. Cl.

| | |
|---|---|
| *H10D 62/17* | (2025.01) |
| *H10B 10/00* | (2023.01) |
| *H10D 62/13* | (2025.01) |
| *H10D 64/01* | (2025.01) |

(52) U.S. Cl.
CPC ........... *H10B 10/12* (2023.02); *H10D 62/151* (2025.01); *H10D 62/235* (2025.01); *H10D 64/018* (2025.01); *H10D 64/021* (2025.01)

(58) Field of Classification Search
CPC . H10B 10/12; H01L 29/0847; H01L 29/1033; H01L 29/66553; H01L 29/6656; H01L 29/0673; H01L 29/42392; H01L 29/78696; H10D 62/151; H10D 62/235; H10D 64/018; H10D 64/021
See application file for complete search history.

(56) References Cited

U.S. PATENT DOCUMENTS

| | | | |
|---|---|---|---|
| 8,210,994 | B2 | 7/2012 | Chang et al. |
| 10,170,484 | B1 | 1/2019 | Sung et al. |
| 10,181,381 | B2 | 1/2019 | Al-Hazmi et al. |
| 10,243,054 | B1 | 3/2019 | Cheng et al. |
| 10,396,169 | B2 | 8/2019 | Cheng et al. |

(Continued)

FOREIGN PATENT DOCUMENTS

KR 2020-0085920 A 7/2020

*Primary Examiner* — Matthew C Landau
*Assistant Examiner* — David W Ward
(74) *Attorney, Agent, or Firm* — Harness, Dickey & Pierce, P.L.C.

(57) ABSTRACT

A semiconductor device comprises an active pattern on a substrate, a pair of first source/drain patterns on the active pattern, a pair of second source/drain patterns on top surfaces of the first source/drain patterns, a gate electrode extending across the active pattern and having sidewalls that face the first and second source/drain patterns, a first channel structure extending across the gate electrode and connecting the first source/drain patterns, and a second channel structure extending across the gate electrode and connecting the second source/drain patterns. The gate electrode includes a first lower part between a bottom surface of the first channel structure and a top surface of the active pattern, and a first upper part between a top surface of the first channel structure and a bottom surface of the second channel structure. The first lower part has a thickness greater than that of the first upper part.

15 Claims, 40 Drawing Sheets

(56) References Cited

U.S. PATENT DOCUMENTS

| | | | |
|---|---|---|---|
| 10,734,447 B2 | 8/2020 | Ando et al. | |
| 2018/0175167 A1* | 6/2018 | Reboh | H01L 29/7848 |
| 2019/0131394 A1* | 5/2019 | Reznicek | H01L 21/30604 |
| 2019/0172751 A1* | 6/2019 | Smith | H01L 27/0924 |
| 2019/0172755 A1* | 6/2019 | Smith | H01L 27/0922 |
| 2019/0319095 A1 | 10/2019 | Zhang et al. | |
| 2020/0006333 A1* | 1/2020 | Noh | H10D 30/6735 |
| 2020/0098756 A1 | 3/2020 | Lilak et al. | |
| 2020/0161339 A1 | 5/2020 | Lee et al. | |
| 2020/0219970 A1 | 7/2020 | Mannebach et al. | |
| 2020/0388681 A1* | 12/2020 | Yamashita | H01L 21/823821 |
| 2021/0035975 A1* | 2/2021 | Kim | H10D 88/00 |
| 2021/0036144 A1 | 2/2021 | Liaw | |
| 2021/0210349 A1* | 7/2021 | Xie | H10D 84/0193 |
| 2021/0407999 A1* | 12/2021 | Huang | H10D 88/00 |
| 2021/0408257 A1* | 12/2021 | Thomas | H01L 21/8221 |
| 2022/0093593 A1* | 3/2022 | Yang | H10D 84/0186 |

* cited by examiner

SEMICONDUCTOR DEVICE

CROSS-REFERENCE TO RELATED APPLICATION

This U.S. nonprovisional application claims priority under 35 U.S.C. § 119 to Korean Patent Application No. 10-2021-0107381 filed on Aug. 13, 2021 in the Korean Intellectual Property Office, the disclosure of which is hereby incorporated by reference in its entirety.

BACKGROUND

The present inventive concepts relate to a semiconductor device, and more particularly, to a semiconductor device including a field effect transistor and a method of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments of the present inventive concepts provide a semiconductor device with enhanced electrical properties and increased reliability.

According to some example embodiments of the present inventive concepts, a semiconductor device may comprise: an active pattern on a substrate; a pair of first source/drain patterns on the active pattern; a pair of second source/drain patterns on top surfaces of the pair of first source/drain patterns; a gate electrode that extends across the active pattern, the gate electrode having sidewalls that face the pair of first source/drain patterns and the pair of second source/drain patterns; a first channel structure that extends across the gate electrode and connects the pair of first source/drain patterns to each other; and a second channel structure that extends across the gate electrode and connects the pair of second source/drain patterns to each other. The gate electrode may include: a first lower part between a bottom surface of the first channel structure and a top surface of the active pattern; and a first upper part between a top surface of the first channel structure and a bottom surface of the second channel structure. The first lower part may have a thickness greater than a thickness of the first upper part.

According to some example embodiments of the present inventive concepts, a semiconductor device may comprise: an active pattern that extends in a first direction on a substrate, the first direction being parallel to a top surface of the substrate or a bottom surface of the substrate; a pair of first source/drain patterns on the active pattern; a pair of second source/drain patterns vertically spaced apart from the pair of first source/drain patterns; a first channel structure that connects the pair of first source/drain patterns to each other; a second channel structure that connects the pair of second source/drain patterns to each other; and a gate electrode that surrounds the first channel structure and the second channel structure, the gate electrode extending in a second direction that intersects the first direction. A distance between a bottom surface of the first channel structure and bottom surfaces of the pair of first source/drain patterns may be less than a distance between a bottom surface of the second channel structure and bottom surfaces of the pair of second source/drain patterns.

According to some example embodiments of the present inventive concepts, a semiconductor device may comprise: an active pattern that extends in a first direction on a substrate, the first direction being parallel to a top surface of the substrate or a bottom surface of the substrate; a pair of first source/drain patterns on the active pattern; a first channel structure including at least one lower semiconductor pattern that connects the pair of first source/drain patterns to each other; a first interlayer dielectric layer on the pair of first source/drain patterns; a pair of second source/drain patterns on the first interlayer dielectric layer, the pair of second source/drain patterns vertically overlapping the pair of first source/drain patterns; a second channel structure including a plurality of upper semiconductor patterns that connect the pair of second source/drain patterns to each other; a second interlayer dielectric layer on the pair of second source/drain patterns; a gate electrode that extends across the first channel structure and the second channel structure, the gate electrode extending in a second direction that intersects the first direction; a plurality of gate spacers on sidewalls of the gate electrode; a gate capping pattern that covers a top surface of the gate electrode between the gate spacers; and a plurality of inner spacers between the gate electrode and the pair of first source/drain patterns. The gate electrode may include: a first lower part between a bottom surface of the first channel structure and a top surface of the active pattern; and a first upper part between a top surface of the first channel structure and a bottom surface of the second channel structure. The first lower part may have a thickness greater than a thickness of the first upper part.

DETAILED DESCRIPTION

Figure 1:
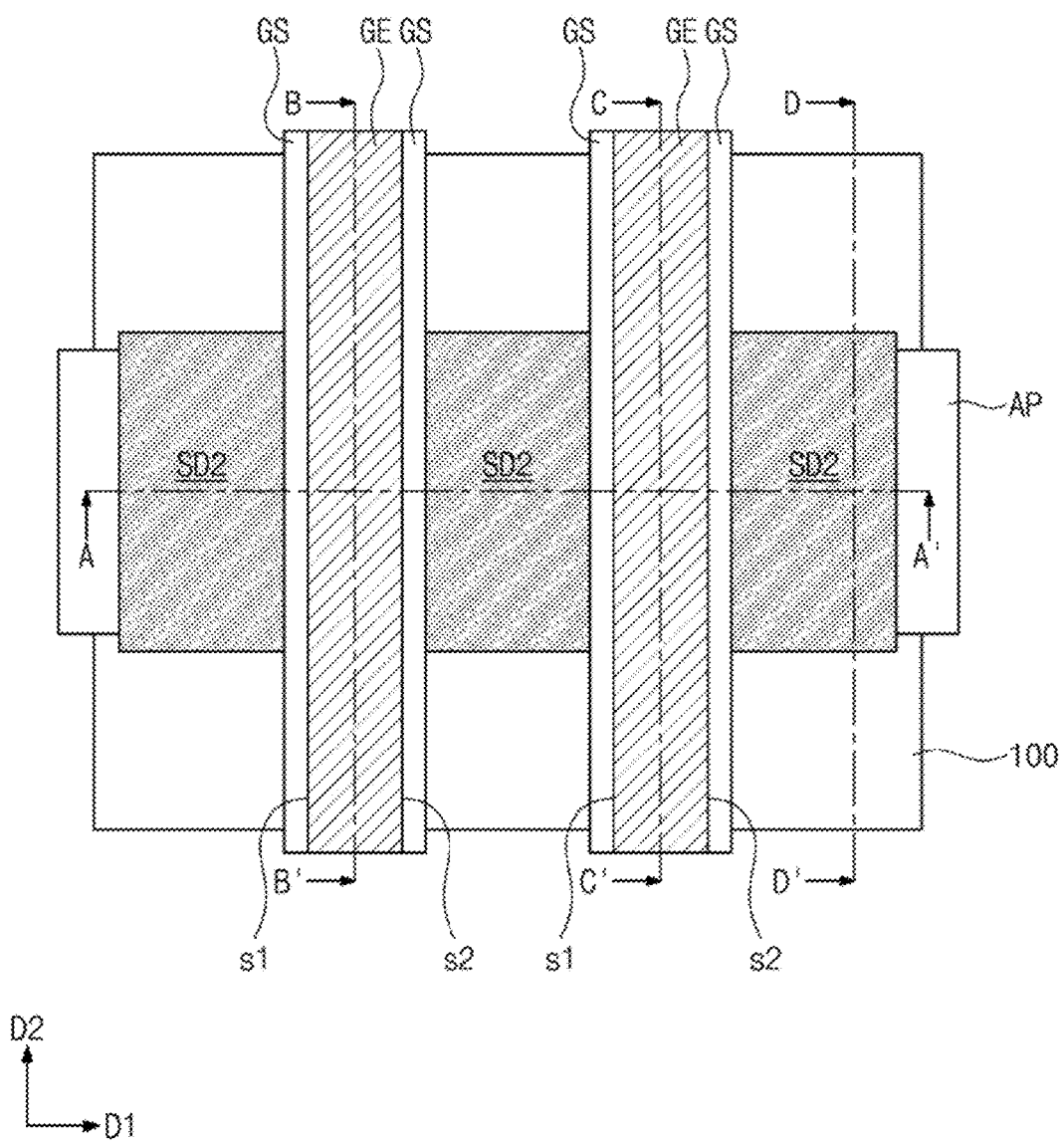
FIG. 1 illustrates a plan view showing a semiconductor device according to some example embodiments of the present inventive concepts.

Hereinafter, semiconductor devices according to some example embodiments of the present inventive concepts, and methods of fabricating same, will be described in conjunction with the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 illustrates a plan view showing a semiconductor device according to some example embodiments of the present inventive concepts. FIGS. 2A, 2B, 2C, and 2D illustrate cross-sectional views respectively taken along lines A-A', B-B', C-C', and D-D' of FIG. 1.

Figure 2A:
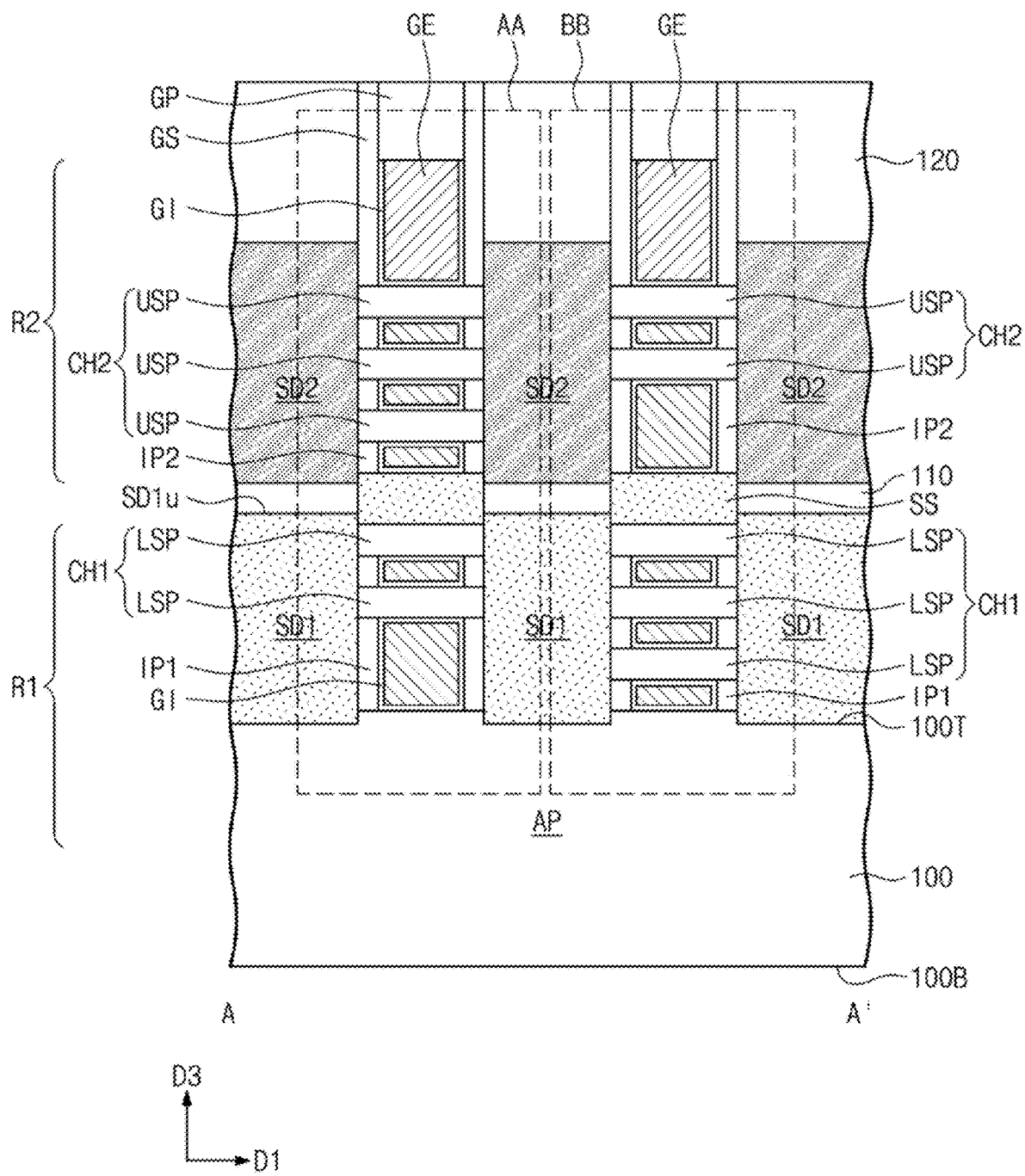
FIGS. 2A, 2B, 2C, and 2D illustrate cross-sectional views respectively taken along lines A-A', B-B', C-C', and D-D' of FIG. 1.

Referring to FIGS. 1 and 2A, a semiconductor device may be provided which includes a first region R1 on a substrate 100 and a second region R2 on the first region R1. The substrate 100 may be a compound semiconductor substrate or a semiconductor substrate including silicon, germanium, or silicon-germanium. Alternatively, the substrate 100 may be a silicon-on-insulator (SOI) substrate.

The first and second regions R1 and R2 may include transistors. The first region R1 may include one of NMOS and PMOS transistors. The second region R2 may include one of NMOS and PMOS transistors that is different from that included in the first region R1. For example, the first region R1 may include an NMOS transistor, and the second region R2 may include a PMOS transistor.

According to some example embodiments, the first and second regions R1 and R2 may be a portion of a standard cell section that constitutes a logic device. The transistors in the first and second regions R1 and R2 may be logic transistors in the standard cell.

According to some example embodiments, the first and second regions R1 and R2 may be a portion of a memory cell section on which are disposed a plurality of transistors for data storage. For example, the transistors in the first and second regions R1 and R2 may be memory transistors included in a static random access memory (SRAM) cell.

The transistors in the first region R1 may include first source/drain patterns SD1 and first channel structures CH1 that connect the first source/drain patterns SD1 to each other. The transistors in the second region R2 may include second source/drain patterns SD2 and second channel structures CH2 that connect the second source/drain patterns SD2 to each other. The transistors in the first and second regions R1 and R2 may be turned on or off in accordance with a switching signal applied to a gate electrode GE. Based on functions in the semiconductor device, the gate electrode GE may be shared or not shared by the transistors in the first and second regions R1 and R2.

A pair of first source/drain patterns SD1 may be spaced apart from each other (e.g., isolated from direct contact with each other) across one gate electrode GE. A pair of second source/drain patterns SD2 may be spaced apart from each other across the one gate electrode GE. The first channel structure CH1 may include lower semiconductor patterns LSP that run across the one gate electrode GE and connect the pair of first source/drain patterns SD1 to each other. The second channel structure CH2 may include upper semiconductor patterns USP that run across the one gate electrode GE and connect the pair of the second source/drain patterns SD2 to each other. In this case, the number of the upper semiconductor patterns USP may be different from that of the lower semiconductor patterns LSP that vertically overlap each other. For example, as depicted in section AA of FIG. 2A, two lower semiconductor patterns LSP may be included in the first channel structure CH1, and three upper semiconductor patterns USP may be included in the second channel structure CH2 that vertically overlaps the first channel structure CH1. For another example, as depicted in section BB of FIG. 2A, three lower semiconductor patterns LSP may be included in the first channel structure CH1, and two upper semiconductor patterns USP may be included in the second channel structure CH2 that vertically overlaps the first channel structure CH1. The first and second channel structures CH1 and CH2 may vertically overlap each other to respectively include the lower and upper semiconductor patterns LSP and USP the numbers of which are different from each other, and may reduce power consumption of the semiconductor device.

It will be understood that the term "number" as used herein with regard to a "number" of elements, may refer to a "quantity" of the elements.

Figure 2B:
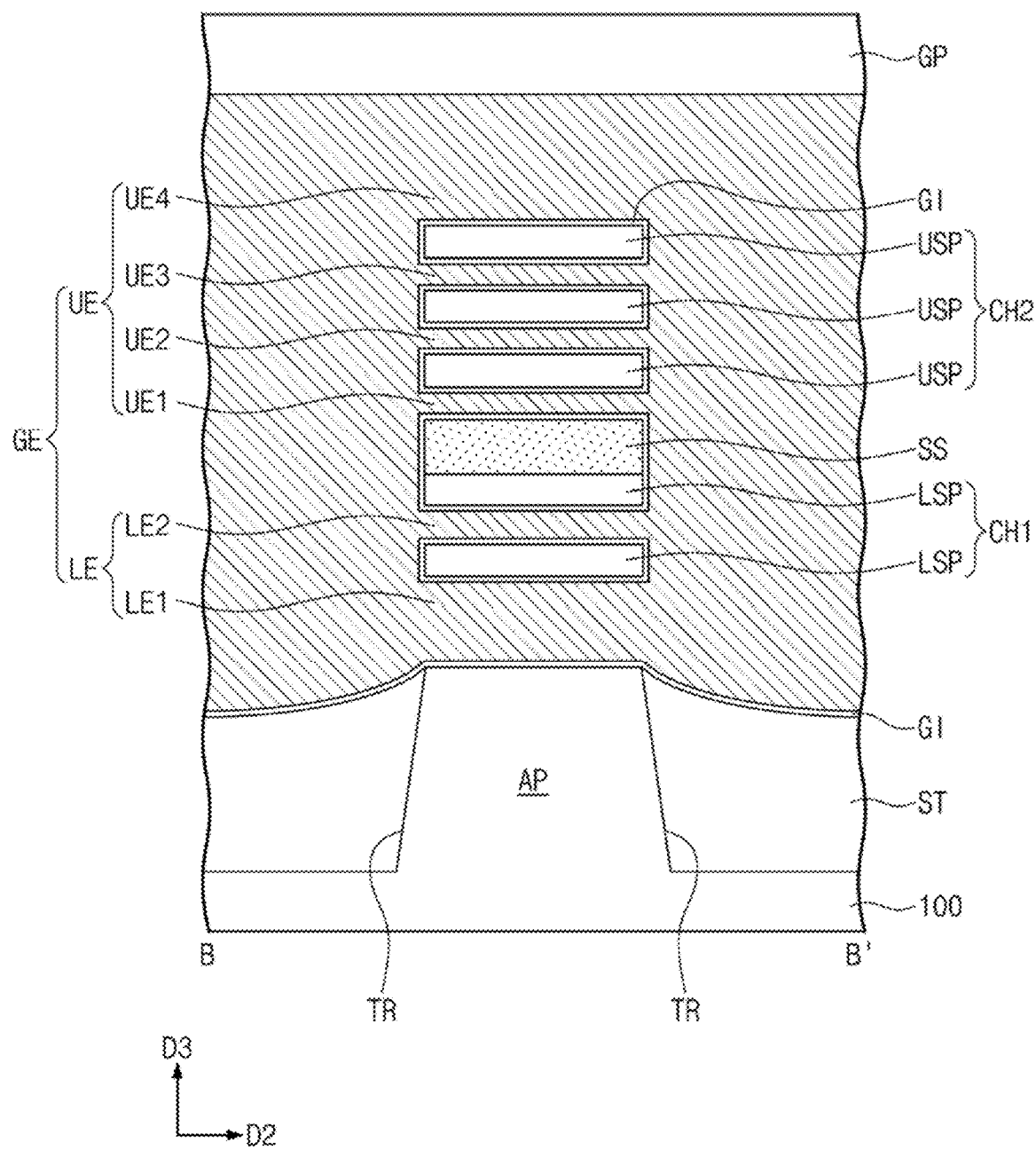
Figure 2C:
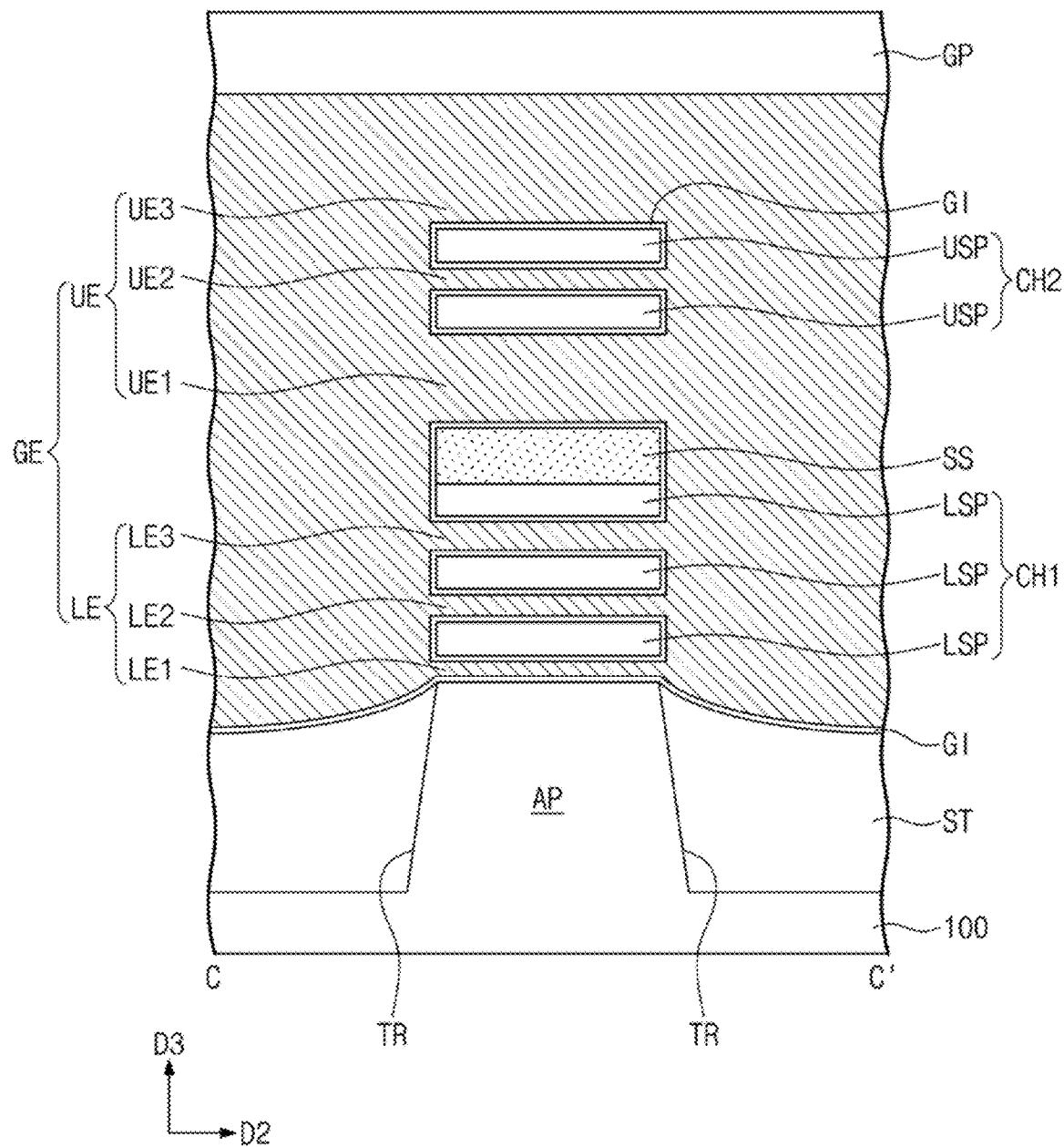
Figure 2D:
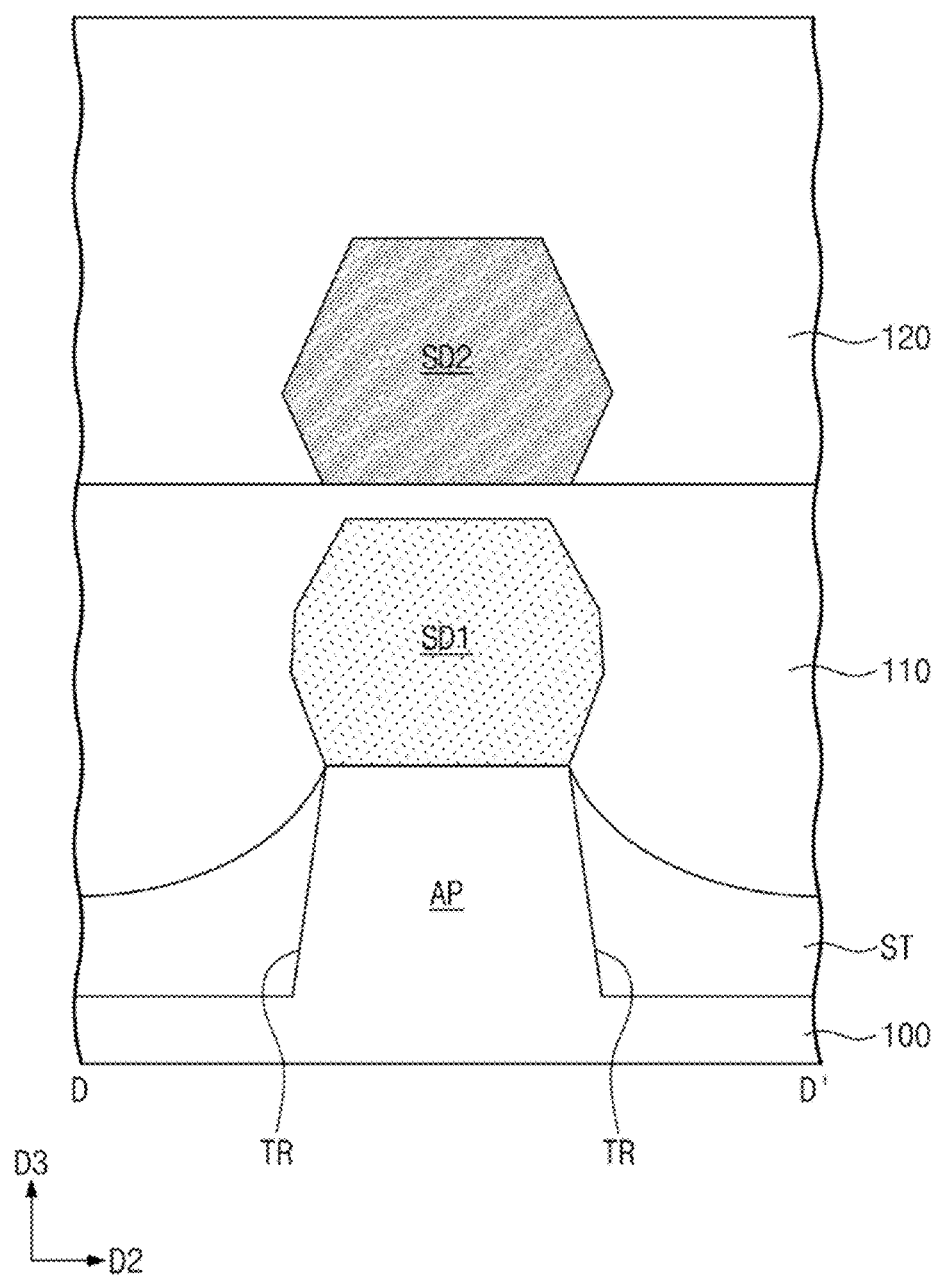

Referring to FIGS. 1 to 2D, an active pattern AP may be provided on the substrate 100. The active pattern AP may extend in a first direction D1 parallel to a top surface 100T or a bottom surface 100B of the substrate 100. The active pattern AP may be defined by a trench TR formed on an upper portion of the substrate 100. According to some example embodiments, the active pattern AP may be a portion of the substrate 100.

A device isolation layer ST may fill the trench TR. The device isolation layer ST may include a silicon oxide layer. The device isolation layer ST may not cover an upper portion of the active pattern AP. The device isolation layer ST may cover sidewalls of the active pattern AP.

The first source/drain patterns SD1 may be provided on the substrate 100. The first source/drain patterns SD1 may be arranged in the first direction D1. The first source/drain patterns SD1 may be spaced apart from each other in the first direction D1. The first source/drain patterns SD1 may be epitaxial patterns formed by a selective epitaxial growth (SEG) process. The first source/drain patterns SD1 may include impurities having a first conductivity type (e.g., n-type). The first source/drain patterns SD1 may include the same semiconductor element (e.g., Si) as that of the substrate 100.

The first channel structures CH1 may be disposed between the first source/drain patterns SD1. The first channel structure CH1 may connect to each other a pair of first source/drain patterns SD1 that are adjacent to each other in the first direction D1. The first channel structure CH1 may include the lower semiconductor patterns LSP that are vertically stacked. The lower semiconductor patterns LSP may be spaced apart from each other in a third direction D3. The lower semiconductor patterns LSP may include silicon (Si), germanium (Ge), or silicon-germanium (SiGe). Each of the lower semiconductor patterns LSP may include, for example, crystalline silicon.

A first interlayer dielectric layer 110 may be provided on the substrate 100. The first interlayer dielectric layer 110 may cover the first source/drain patterns SD1. The first interlayer dielectric layer 110 may have a top surface located at a higher level than that of top surfaces SD1$u$ of the first source/drain patterns SD1. The first interlayer dielectric layer 110 may have a bottom surface in contact with the device isolation layer ST. The bottom surface of the first interlayer dielectric layer 110 may be located at a lower level than that of a top surface of the active pattern AP.

In the present specification, the term 'level' may mean a vertical height and/or a distance from a reference location (e.g., the top surface 100T of the substrate 100, the bottom surface 100B of the substrate 100, or the like) in a vertical direction (e.g., the third direction D3, which may be perpendicular to the top surface 100T of the substrate 100, the bottom surface 100B of the substrate 100, or the like). A reference location may be understood to be a location that a height, level, and/or relative level of an element is "with respect to," "based on," or is a level "from." For example, when a first element is described herein to be at a level higher than a level of a second element, the first element may be further from the reference location in the vertical direction (e.g., the third direction D3) than the second element. In another example, when a first element is described herein to be at a level lower than a level of a second element, the first element may be closer to reference location in the vertical direction (e.g., third direction D3) than the second element. In another example, when a first element is described herein to have a level that is between levels of two other elements, the first element may be further from the reference location in the vertical direction from one of the other elements and closer to the reference location in the vertical direction than another one of the other elements.

The second source/drain patterns SD2 may be provided on the top surfaces SD1$u$ of the first source/drain patterns SD1. The second source/drain patterns SD2 may vertically overlap the first source/drain patterns SD1. The second source/drain patterns SD2 may be arranged in the first direction D1. The second source/drain patterns SD2 may be spaced apart from each other in the first direction D1. The second source/drain patterns SD2 may be epitaxial patterns formed by a selective epitaxial growth (SEG) process. The second source/drain patterns SD2 may include impurities having a second conductivity type (e.g., p-type). The second source/drain patterns SD2 may include a semiconductor element (e.g., SiGe) whose lattice constant is greater than that of a semiconductor element of the substrate 100.

The second channel structures CH2 may be disposed between the second source/drain patterns SD2. The second channel structure CH2 may connect to each other a pair of second source/drain patterns SD2 that are adjacent to each other in the first direction D1. The second channel structure CH2 may include the upper semiconductor patterns USP that are vertically stacked. The upper semiconductor patterns USP may be spaced apart from each other in the third direction D3. Each of the upper semiconductor patterns USP may be interposed between a pair of second source/drain patterns SD2 and may be provided with compressive stress. The upper semiconductor patterns USP may include silicon (Si), germanium (Ge), or silicon-germanium (SiGe). Each of the upper semiconductor patterns USP may include, for example, crystalline silicon.

A plurality of separation dielectric patterns SS may be provided between the first channel structures CH1 and the second channel structures CH2. Each of the separation dielectric patterns SS may be positioned on a top surface of an uppermost one of the lower semiconductor patterns LSP. The separation dielectric pattern SS may be in contact with the uppermost lower semiconductor pattern LSP.

A second interlayer dielectric layer 120 may be provided on the first interlayer dielectric layer 110. The second interlayer dielectric layer 120 may cover the second source/drain patterns SD2. The second interlayer dielectric layer 120 may cover lateral and top surfaces of the second source/drain patterns SD2. The second interlayer dielectric layer 120 may not cover bottom surfaces of the second source/drain patterns SD2.

A plurality of gate electrodes GE may be provided to extend in a second direction D2 while running across the active pattern AP. It will be understood that an element described as "running" or the like across another element may be interchangeably referred to as "extending" or the like across the other element. The second direction D2 may intersect the first direction D1. The second direction D2 may be perpendicular to the first direction D1. The second direction D2 may be parallel to the top surface or the bottom surface of the substrate 100. The gate electrodes GE may be arranged in the first direction D1. The gate electrode GE may extend between a pair of first source/drain patterns SD1 and between a pair of second source/drain patterns SD2. The gate electrode GE may have opposite sidewalls s1 and s2 that face a pair of first source/drain patterns SD1 and a pair of second source/drain patterns SD2. For example, a pair of first source/drain patterns SD1 may be provided on opposite sidewalls s1 and s2 of the gate electrode GE. A pair of second source/drain patterns SD2 may be provided on opposite sidewalls s1 and s2 of the gate electrode GE and may be spaced apart in the third direction D3 from a pair of first source/drain patterns SD1. The third direction D3 may intersect the first direction D1 and/or the second direction D2. The third direction D3 may be perpendicular to both the first direction D1 and the second direction D2. The third direction D3 may be perpendicular to the top surface or the bottom surface of the substrate 100.

The gate electrode GE may run across the first channel structure CH1 and the second channel structure CH2. The gate electrode GE may include a lower part LE that at least partially surrounds the first channel structure CH1 and an upper part UE that at least partially surrounds the second channel structure CH2 (see FIGS. 2B and 2C). A transistor according to some example embodiments of the present inventive concepts may be a three-dimensional field effect transistor (e.g., MBCFET) in which the gate electrode GE three-dimensionally surrounds the first and second channel structures CH1 and CH2. The lower part LE of the gate electrode GE may switch lower transistors that include the first channel structures CH1 and the first source/drain patterns SD1. The upper part UE of the gate electrode GE may switch upper transistors that include the second channel structures CH2 and the second source/drain patterns SD2. The lower and upper parts LE and UE of the gate electrode GE may be electrically connected to each other and may be controlled at the same time. The lower part LE of the gate electrode GE may be positioned between the lower semiconductor patterns LSP and between the active pattern AP and the lower semiconductor patterns LSP. The upper part UE of the gate electrode GE may be positioned between the upper semiconductor patterns USP and on a top surface of an uppermost one of the upper semiconductor patterns USP.

A plurality of gate spacers GS may be disposed on opposite sidewalls s1 and s2 of the gate electrode GE. The gate spacers GS may extend in the second direction D2 along the gate electrode GE. The gate spacers GS may have their top surfaces located at a higher level than that of a top surface of the gate electrode GE. The top surfaces of the gate spacers GS may be coplanar with that of the second interlayer dielectric layer 120. The gate spacers GS may include at least one selected from SiCN, SiCON, and SiN. According to some example embodiments, the gate spacers GS may include a multi-layer consisting of at least two selected from SiCN, SiCON, and SiN.

A gate capping pattern GP may be provided on the gate electrode GE. The gate capping pattern GP may extend in the second direction D2 along the gate electrode GE. The gate capping pattern GP may include at least selected from SiON, SiCN, SiCON, and SiN.

A gate dielectric layer GI may be interposed between the gate electrode GE and the first channel structure CH1 and between the gate electrode GE and the second channel structure CH2. The gate dielectric layer GI may cover top, bottom, and lateral surfaces of the lower semiconductor patterns LSP and of the upper semiconductor patterns USP. The gate dielectric layer GI may cover a top surface of the device isolation layer ST below the gate electrode GE and may also cover a top surface and lateral surfaces of the separation dielectric pattern SS (see FIGS. 2B and 2C).

According to some example embodiments, the gate dielectric layer GI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate. According to some example embodiments, a semiconductor device of the present inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, at least one selected from hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the present inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the present inventive concepts are not limited thereto. Because ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stacked structure in which a plurality of ferroelectric material layers are alternately stacked with a plurality of paraelectric material layers.

The gate electrode GE may include a first metal pattern and a second metal pattern on the first metal pattern. The gate dielectric layer GI may be provided thereon with the first metal pattern that is adjacent to the lower semiconductor patterns LSP and the upper semiconductor patterns USP. The first metal pattern may include a work-function metal that controls a threshold voltage of a transistor. A thickness and composition of the first metal pattern may be adjusted to achieve a desired threshold voltage of a transistor. For example, the lower part LE between two neighboring lower semiconductor patterns LSP and the upper part UE between two neighboring upper semiconductor patterns USP may be formed of the first metal pattern or a work-function metal.

The first metal pattern may include a metal nitride layer. For example, the first metal pattern may include nitrogen (N) and at least one metal, such as titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal, such as tungsten (W), aluminum (Al), titanium (Ti), and tantalum (Ta).

A plurality of lower inner spacers IP1 may be provided between the gate electrode GE and the first source/drain patterns SD1. A plurality of upper inner spacers IP2 may be provided between the gate electrode GE and the second source/drain patterns SD2. The lower inner spacers IP1 may be positioned between top and bottom surfaces of the lower semiconductor patterns LSP. The upper inner spacers IP2 may be positioned between top and bottom surfaces of the upper semiconductor patterns USP.

Figure 3A:
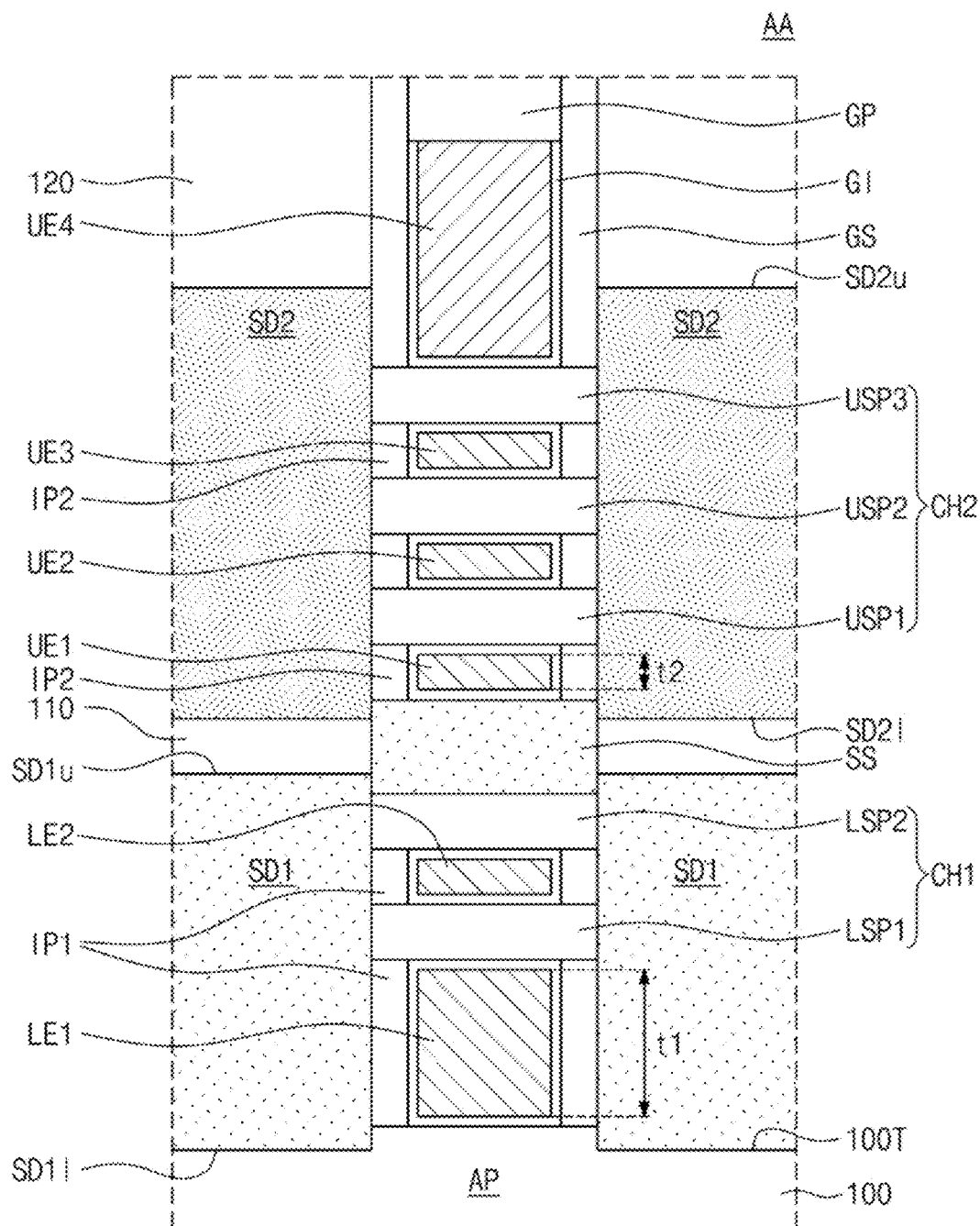
FIGS. 3A and 3B illustrate enlarged cross-sectional views respectively showing sections AA and BB of FIG. 2A.
Figure 3B:
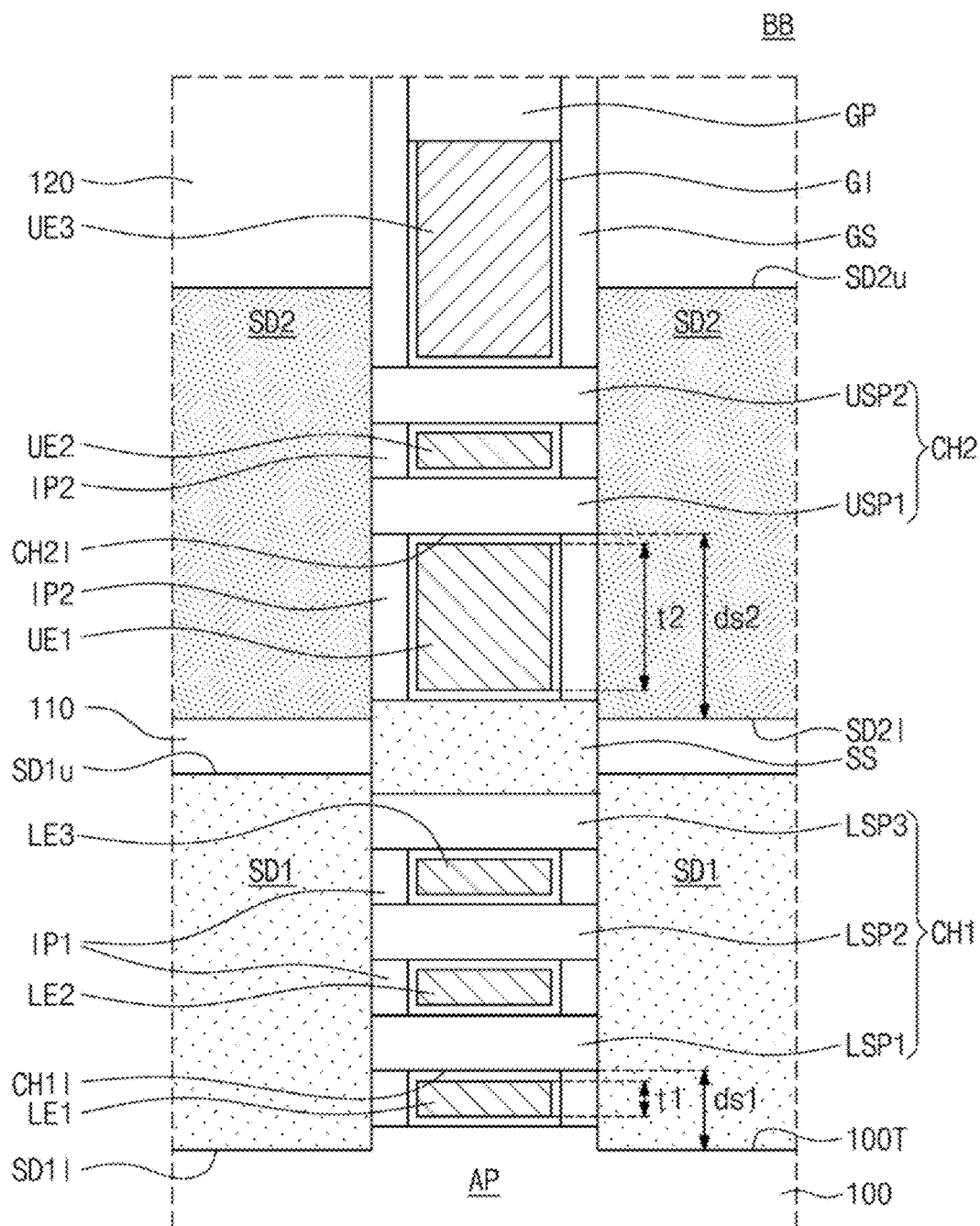

FIGS. 3A and 3B illustrate enlarged cross-sectional views respectively showing sections AA and BB of FIG. 2A.

Referring to FIGS. 2A, 2B, and 3A, there is a detailed description of some example embodiments in each of which the number of the upper semiconductor patterns USP is greater than the number of the lower semiconductor patterns LSP that vertically overlap each other. The lower semiconductor patterns LSP in a single first channel structure CH1 discussed with reference to FIGS. 2A to 2C may include a first lower semiconductor pattern LSP1, a second lower semiconductor pattern LSP2, and a third lower semiconductor pattern LSP3 that are stacked in an ascending order in terms of their level. In addition, the upper semiconductor patterns USP in a single second channel structure CH2 discussed with reference to FIGS. 2A to 2C may include a first upper semiconductor pattern USP1, a second upper semiconductor pattern USP2, and a third upper semiconductor pattern USP3 that are stacked in an ascending order in terms of their level. There will be omission of detailed description about the same component explained above.

The first channel structure CH1 may include first and second lower semiconductor patterns LSP1 and LSP2 that are vertically stacked. The second channel structure CH2 may include first, second, and third upper semiconductor patterns USP1, USP2, and USP3 that are vertically stacked. The first and second lower semiconductor patterns LSP1 and LSP2 may have the same thickness as that of the first, second, and third upper semiconductor patterns USP1, USP2, and USP3. The first, second, and third upper semiconductor patterns USP1, USP2, and USP3 may be disposed at a regular interval along the third direction D3. For example, a distance (e.g., in the third direction D3) between the first and second upper semiconductor patterns USP1 and USP2 may be the same as a distance between the second and third upper semiconductor patterns USP2 and USP3.

As used herein, a "thickness" of an element may refer to a dimension (e.g., distance) of the element in a vertical direction that is perpendicular to the top surface or bottom surface of the substrate 100 (e.g., the third direction D3), e.g., a vertical length, length in the third direction D3, distance in the third direction D3, etc. As used herein, a "width" of an element may refer to a dimension (e.g., distance) of the element in a horizontal direction that is parallel to the top surface or bottom surface of the substrate 100 (e.g., the first direction D1 and/or the second direction D2).

The first and second lower semiconductor patterns LSP1 and LSP2 may provide electron migration paths between the first source/drain patterns SD1, and the first, second, and third upper semiconductor patterns USP1, USP2, and USP3 may provide electron migration paths between the second source/drain patterns SD2. The first and second lower semiconductor patterns LSP1 and LSP2 may be formed closer to top surfaces SD1$u$ of the first source/drain patterns SD1 than to bottom surfaces SD1$l$ of the first source/drain patterns SD1, and thus there may be a reduction in distance (e.g., in the third direction D3) between the first and second lower semiconductor patterns LSP1 and LSP2 and active contacts (see AC1, AC2, and AC3 of FIG. 7). Accordingly, the semiconductor device may decrease in operation voltage, which may improve electrical properties of the semiconductor device, reliability of the semiconductor device, or the like.

The gate electrode GE may include first, second, third, and fourth upper parts UE1, UE2, UE3, and UE4 and may also include first and second lower parts LE1 and LE2. The first upper part UE1 may be positioned between a bottom surface of the first upper semiconductor pattern USP1 and a top surface of the second lower semiconductor pattern LSP2. The second upper part UE2 may be positioned between a top surface of the first upper semiconductor pattern USP1 and a bottom surface of the second upper semiconductor pattern USP2. The third upper part UE3 may be positioned between a top surface of the second upper semiconductor pattern USP2 and a bottom surface of the third upper semiconductor pattern USP3. The first, second, and third upper parts UE1, UE2, and UE3 may have the same thickness. The fourth upper part UE4 may be positioned on a top surface of the third upper semiconductor pattern USP3. The fourth upper part UE4 may have a thickness greater than that of the first, second, and third upper parts UE1, UE2, and UE3. For example, the thickness of the fourth upper part UE4 may be greater than that of any other one of the first, second, and third upper parts UE1, UE2, and UE3.

The first lower part LE1 may be positioned between a bottom surface of the first lower semiconductor pattern LSP1 and a top surface of the active pattern AP. The second lower part LE2 may be positioned between the first and second lower semiconductor patterns LSP1 and LSP2. The second lower part LE2 may have the same thickness as that of the first, second, and third upper parts UE1, UE2, and UE3. The first lower part LE1 may have a thickness t1 greater than a thickness t2 of the first upper part UE1. According to some example embodiments, the thickness t1 of the first lower part LE1 may be about 2 to 4 times the thickness of each of the semiconductor patterns LSP and USP. As the thickness t1 of the first lower part LE1 is greater than the thickness t2 of the first upper part UE1, the lower transistor (e.g., the pair of first source/drain patterns SD1 and the first channel structure CH1) may decrease in operating voltage which may improve electrical properties of the semiconductor device, reliability of the semiconductor device, or the like.

The lower inner spacers IP1 may be provided on a sidewall of the first lower part LE1 and a sidewall of the second lower part LE2. The upper inner spacers IP2 may be provided on sidewalls of the first, second, and third upper parts UE1, UE2, and UE3. The lower inner spacer IP1 on the sidewall of the first lower part LE1 may have a length in the third direction D3 greater than a length in the third direction D3 of each of the upper inner spacers IP2.

Referring to FIGS. 2A, 2C, and 3B, there is a detailed description of some example embodiments in each of which the number of the upper semiconductor patterns USP is less than the number of the lower semiconductor patterns LSP that vertically overlap each other. There will be omission of detailed description about the same component explained above.

The first channel structure CH1 may include first, second, and third lower semiconductor patterns LSP1, LSP2, and LSP3 that are vertically stacked. The second channel structure CH2 may include first and second upper semiconductor patterns USP1 and USP2 that are vertically stacked. The first, second, and third lower semiconductor patterns LSP1, LSP2, and LSP3 may have the same thickness as that of the first and second upper semiconductor patterns USP1 and USP2. The first, second, and third lower semiconductor patterns LSP1, LSP2, and LSP3 may be disposed at a regular interval along the third direction D3. For example, a distance (e.g., in the third direction D3) between the first and second lower semiconductor patterns LSP1 and LSP2 may be the same as a distance (e.g., in the third direction D3) between the second and third lower semiconductor patterns LSP2 and LSP3.

The gate electrode GE may include first, second, and third upper parts UE1, UE2, and UE3 and may also include first, second, and third lower parts LE1, LE2, and LE3. The first lower part LE1 may be positioned between a bottom surface CH1$l$ of the first channel structure CH1 and a top surface of the active pattern AP. The second lower part LE2 may be positioned between the first and second lower semiconductor patterns LSP1 and LSP2. The third lower part LE3 may be positioned between the second and third lower semiconductor patterns LSP2 and LSP3. The first, second, and third lower parts LE1, LE2, and LE3 may have the same thickness.

The first upper part UE1 may be positioned between the first channel structure CH1 and the second channel structure CH2. For example, the first upper part UE1 may be positioned between a bottom surface CH2*l* of the second channel structure CH2 and a top surface of the separation dielectric pattern SS. The second upper part UE2 may be positioned between a top surface of the first upper semiconductor pattern USP1 and a bottom surface of the second upper semiconductor pattern USP2. The third upper part UE3 may be positioned on a top surface of the second upper semiconductor pattern USP2. The second upper part UE2 may have a thickness less than that of any other one of the first and third upper parts UE1 and UE3.

The second channel structure CH2 may be formed closer to a top surface SD2*u* of the second source/drain pattern SD2 than to a bottom surface SD2*l* of the second source/drain pattern SD2. A distance ds2 (e.g., in the third direction D3) between the bottom surface CH2*l* of the second channel structure CH2 and the bottom surface SD2*l* of the second source/drain pattern SD2 may be greater than a distance ds1 (e.g., in the third direction D3) between the bottom surface CH1*l* of the first channel structure CH1 and the bottom surface SD1*l* of the first source/drain pattern SD1. An increase in the distance ds2, between the bottom surface CH2*l* of the second channel structure CH2 and the bottom surface SD2*l* of the second source/drain pattern SD2, may cause that the first upper part UE1 is formed to have a thickness t2 greater than the thickness of each of the first, second, and third lower parts LE1, LE2, and LE3. Accordingly, the semiconductor device may decrease in operation voltage, which may improve electrical properties of the semiconductor device, reliability of the semiconductor device, or the like.

Figure 4A:
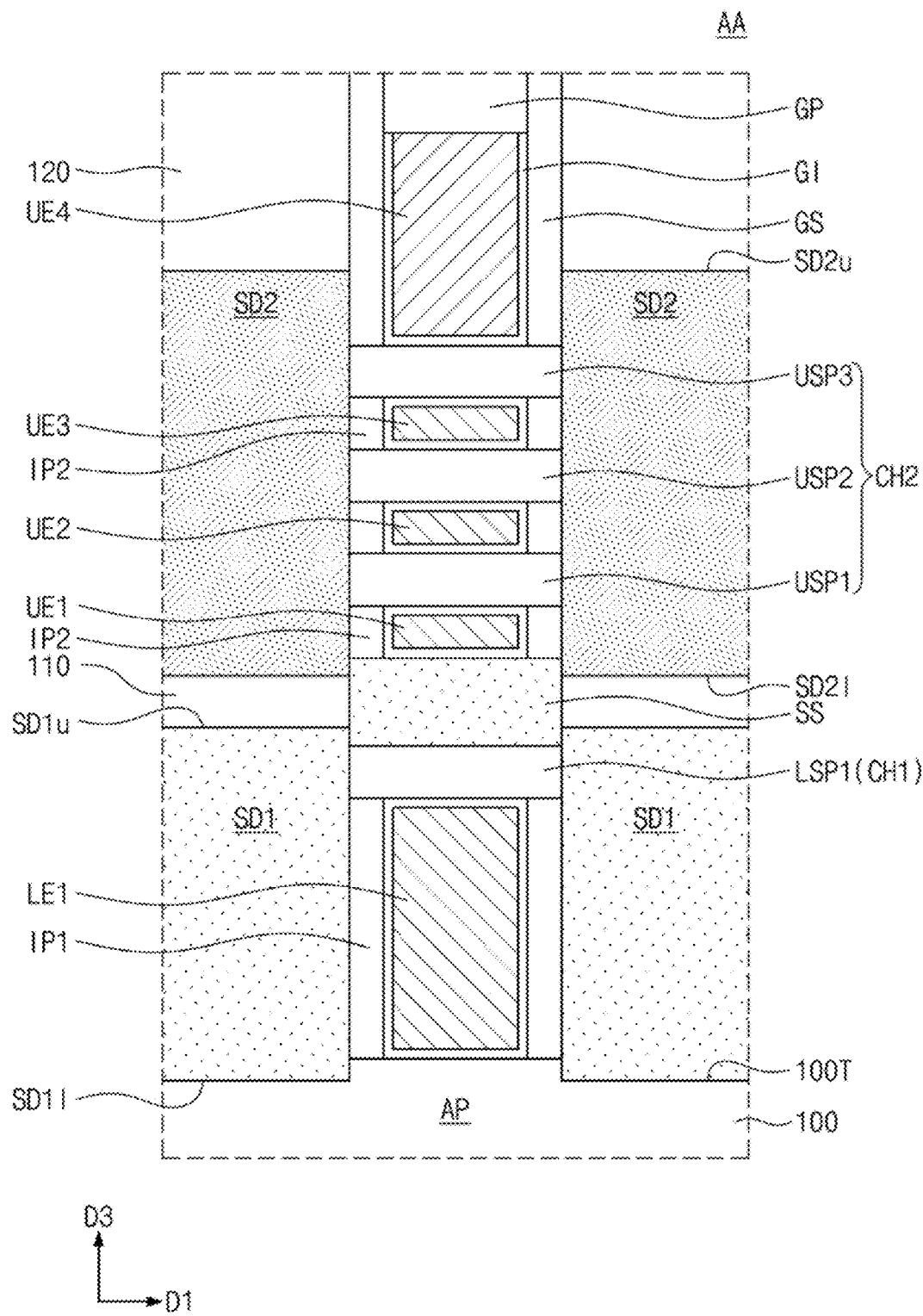
FIGS. 4A and 4B illustrate enlarged cross-sectional views respectively showing sections AA and BB of FIG. 2A.
Figure 4B:
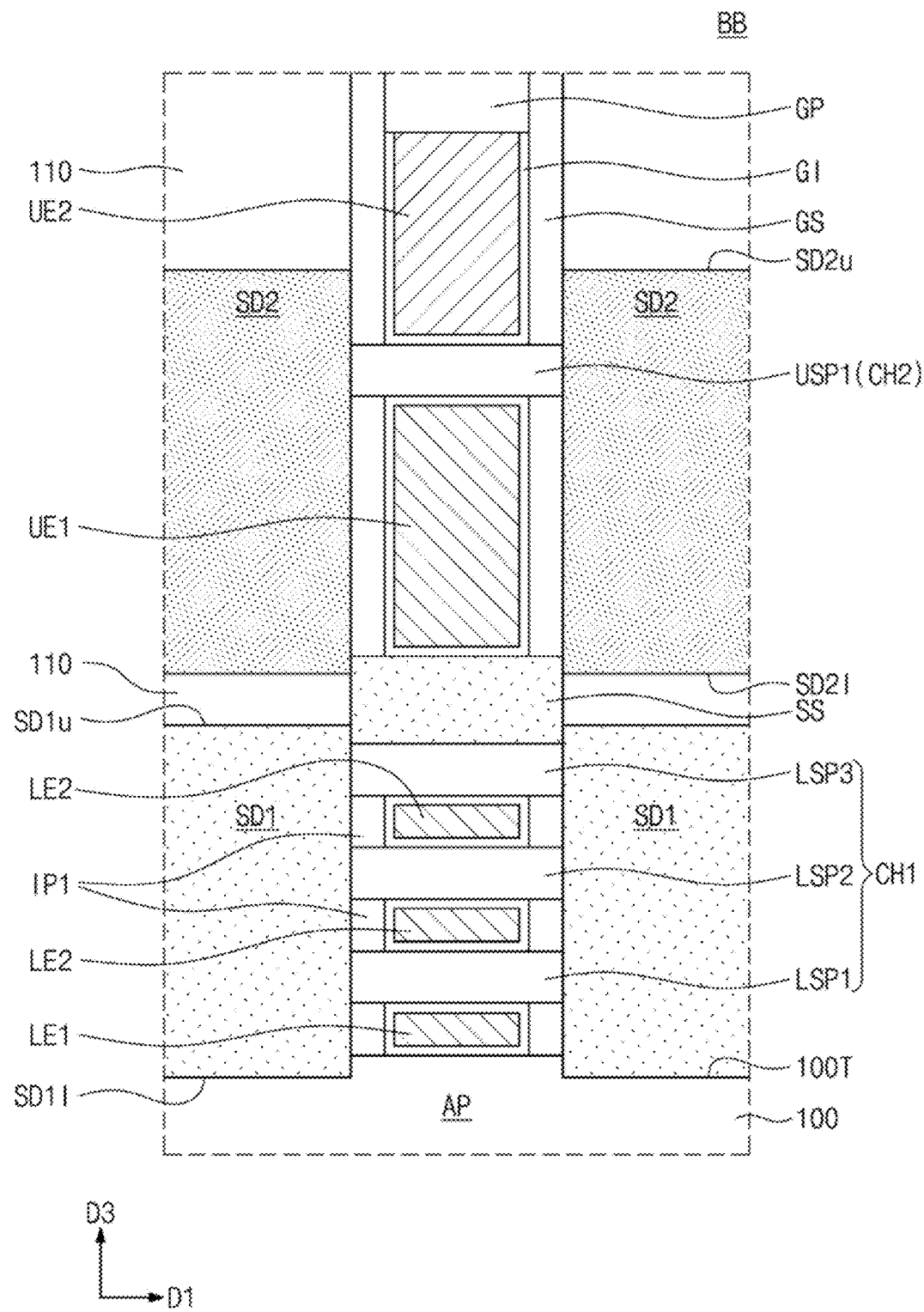

FIGS. 4A and 4B illustrate enlarged cross-sectional views respectively showing sections AA and BB of FIG. 2A. There will be omission of detailed description about the same component explained above.

Referring to FIG. 4A, the first channel structure CH1 may include only one lower semiconductor pattern LSP1. For example, most of electron migration between a pair of first source/drain patterns SD1 may be carried out through the one lower semiconductor pattern LSP1. The lower semiconductor pattern LSP1 may be closer to the top surface SD1*u* than to the bottom surface SD1*l* of the first source/drain pattern SD1. The first lower part LE1 of the gate electrode GE may have a thickness greater than that of the fourth upper part UE4 on a top surface of the second channel structure CH2.

Referring to FIG. 4B, the second channel structure CH2 may include only one upper semiconductor pattern USP1. For example, most of electron migration between a pair of second source/drain patterns SD2 may be carried out through the one upper semiconductor pattern USP1. The upper semiconductor pattern USP1 may be closer to the top surface SD2*u* than to the bottom surface SD2*l* of the second source/drain pattern SD2. The first upper part UE1 of the gate electrode GE may have a thickness greater than that of the second upper part UE2 on a top surface of the upper semiconductor pattern USP1.

Figure 5A:
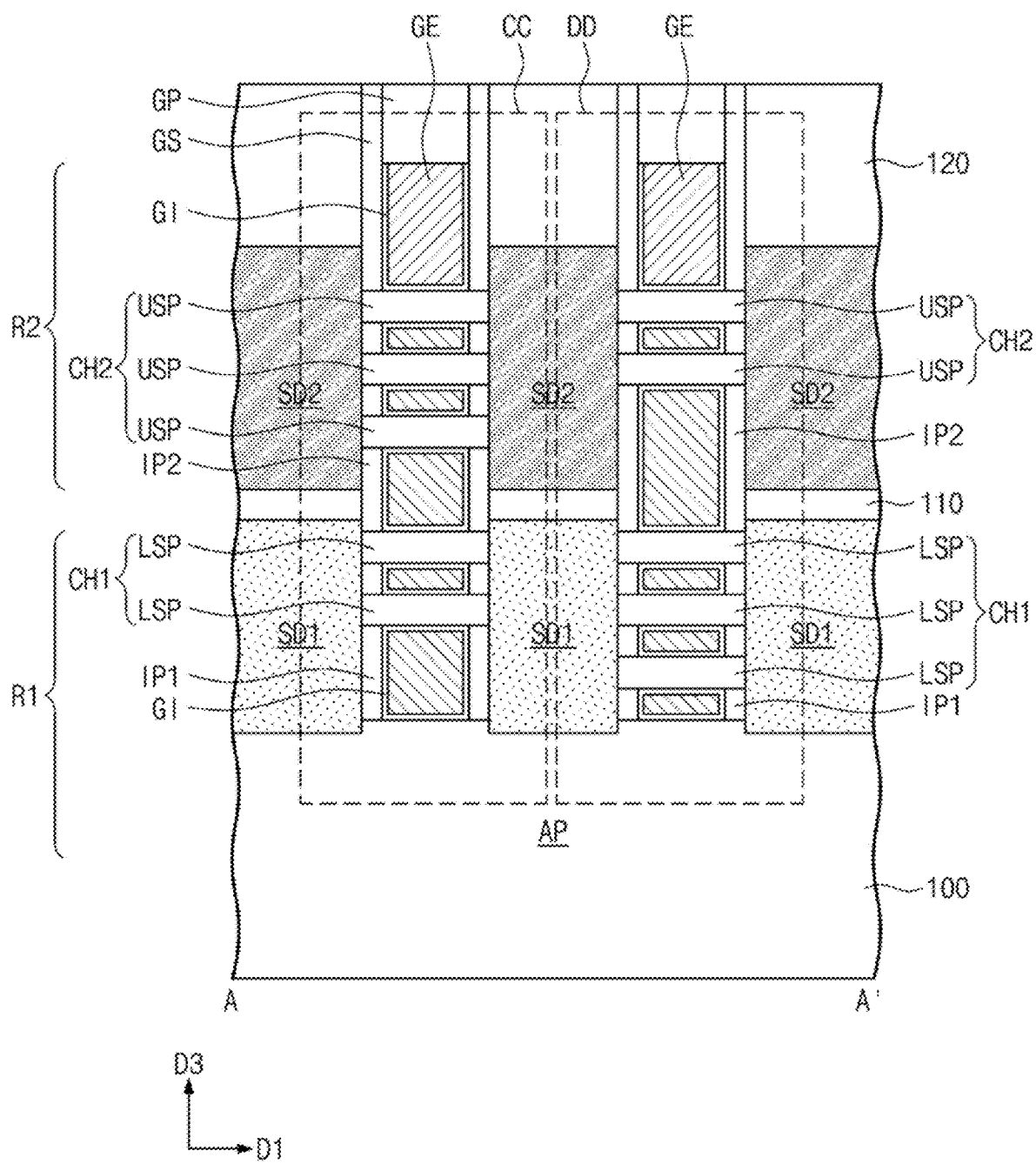
FIGS. 5A, 5B, and 5C illustrate cross-sectional views respectively taken along lines A-A', B-B', and C-C' of FIG. 1, showing a semiconductor device according to some example embodiments of the present inventive concepts.
Figure 5B:
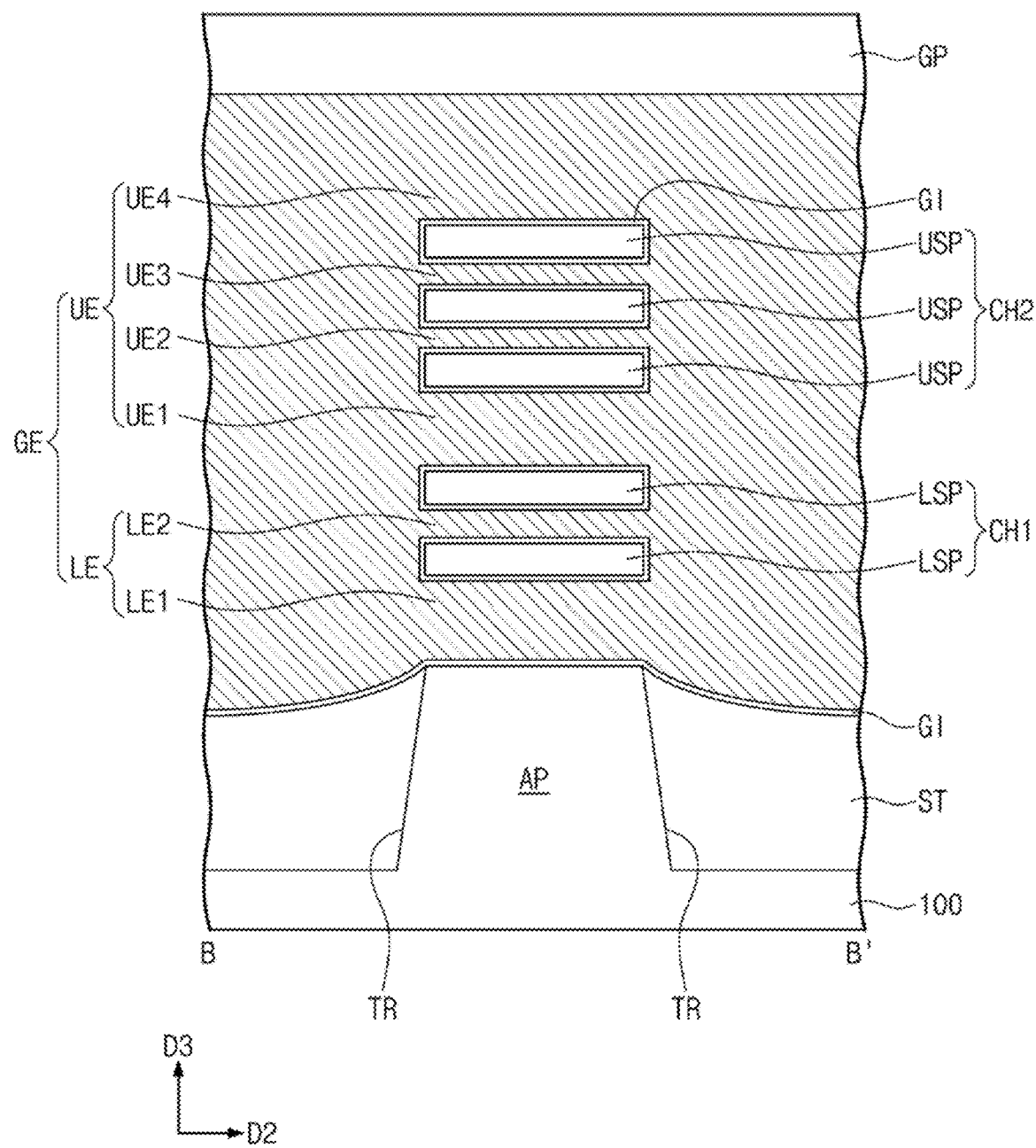
Figure 5C:
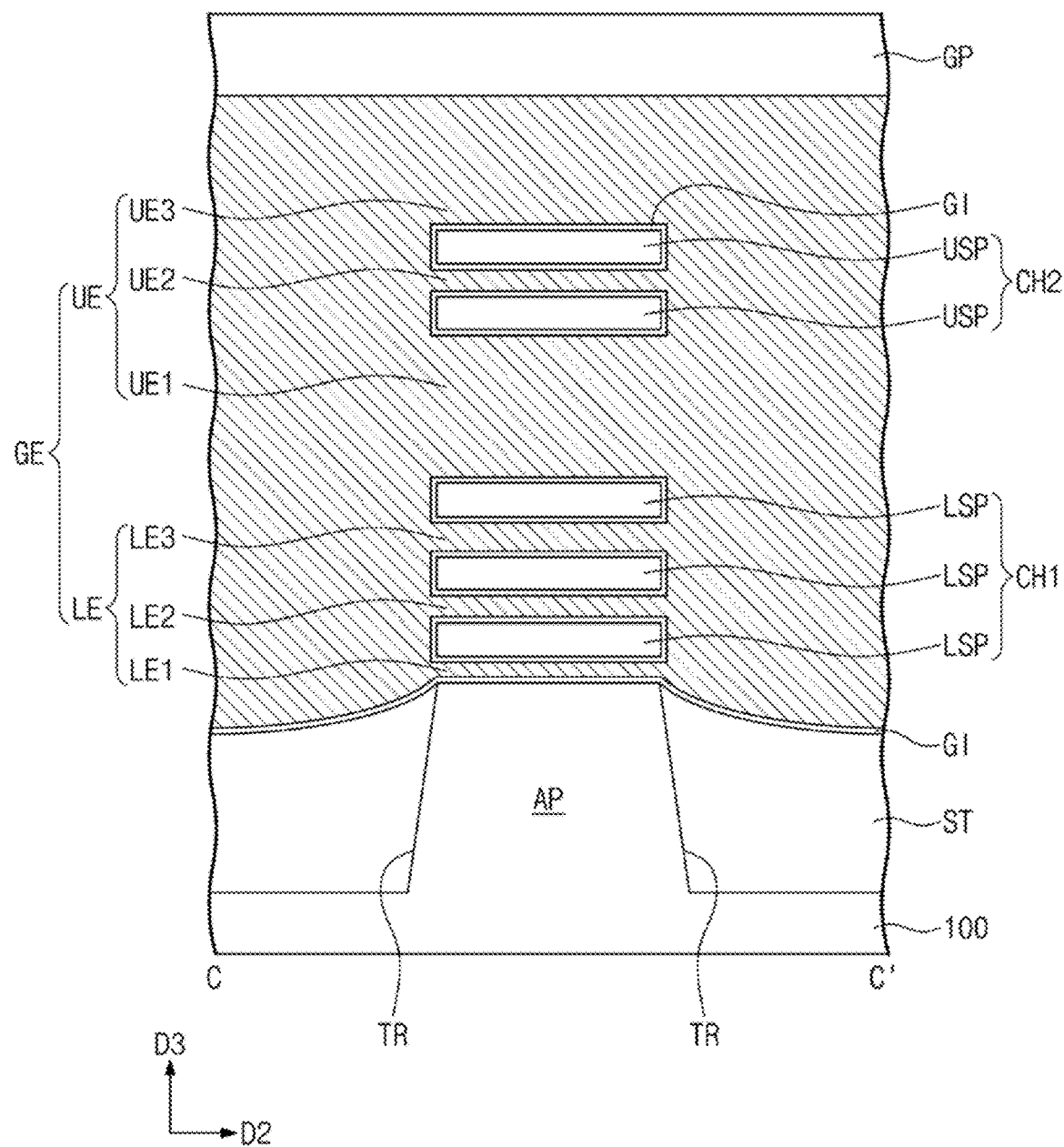
Figure 6A:
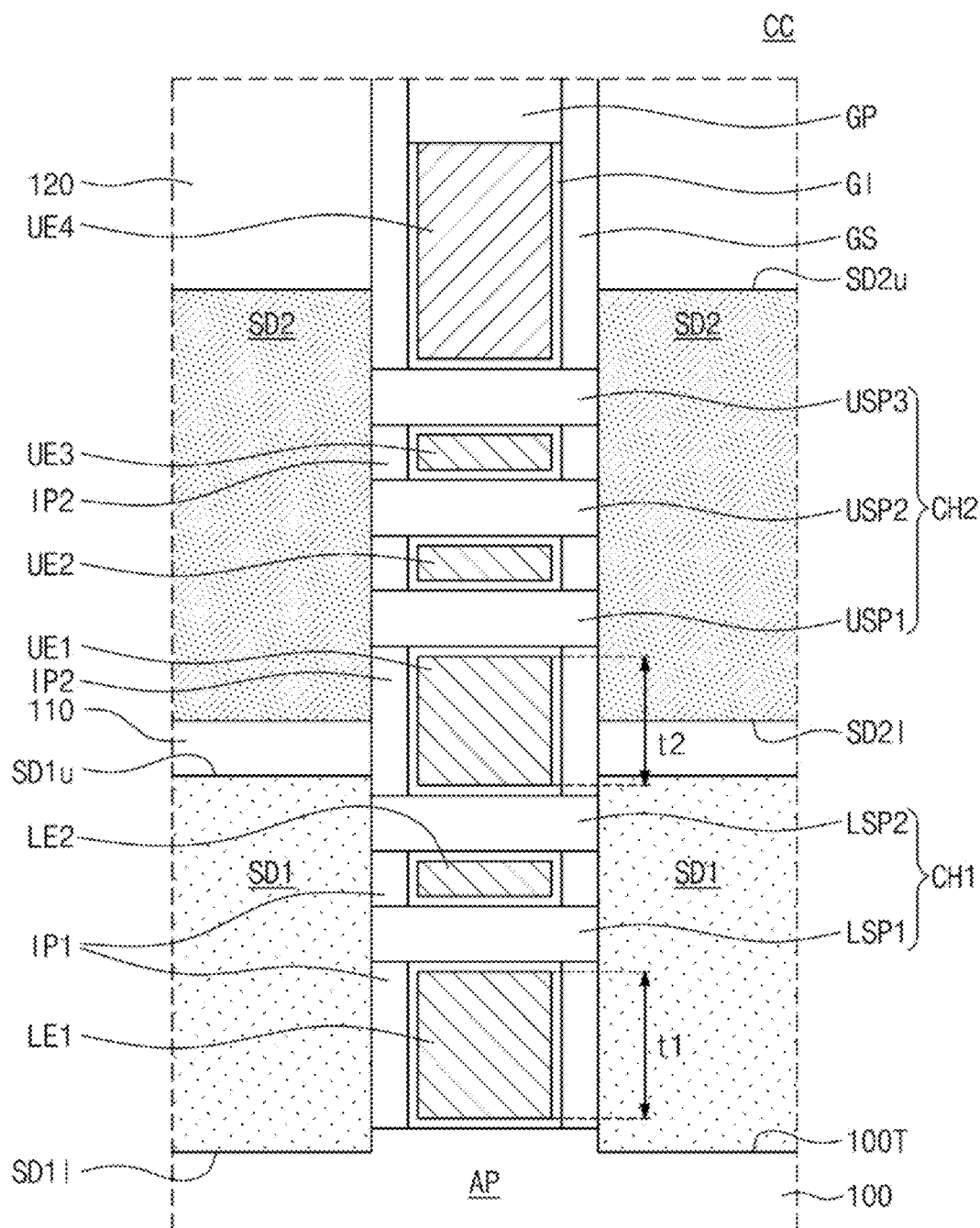
FIGS. 6A and 6B illustrate enlarged cross-sectional views respectively showing sections CC and DD of FIG. 5A.
Figure 6B:
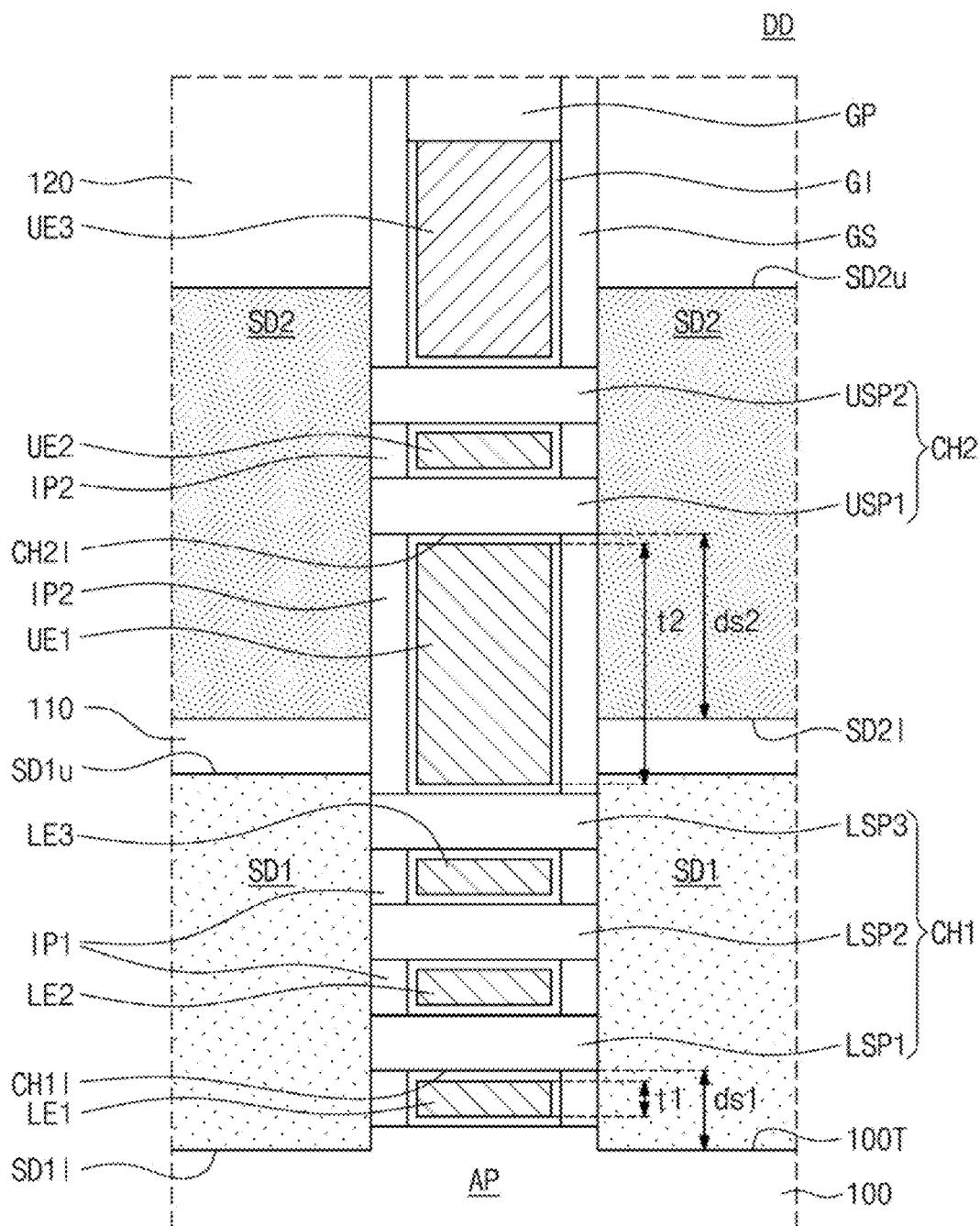

FIGS. 5A, 5B, and 5C illustrate cross-sectional views respectively taken along lines A-A', B-B', and C-C' of FIG. 1, showing a semiconductor device according to some example embodiments of the present inventive concepts. FIGS. 6A and 6B illustrate enlarged cross-sectional views respectively showing sections CC and DD of FIG. 5A. A description of the same technical features as those of the semiconductor device discussed above may be omitted, and a difference thereof will be explained.

Referring to FIGS. 5A to 6B, differently from the discussion with reference to FIGS. 2A to 2C, a semiconductor device according to some example embodiments of the present inventive concepts may not include the separation dielectric patterns SS. The separation dielectric patterns SS may be formed of the same material as that of first and second sacrificial layers SAL1 and SAL2 which will be discussed in FIG. 14, and may be removed together with the first and second sacrificial layers SAL1 and SAL2. Spaces where the separation dielectric patterns SS may be filled with the gate electrode GE.

For example, the first upper part UE1 of the gate electrode GE may be provided between a top surface of the first channel structure CH1 and a bottom surface of the second channel structure CH2, and may be adjacent to the lower semiconductor pattern LSP and the upper semiconductor pattern USP. The first upper part UE1 may have a top surface located at a higher level than that of the bottom surface SD2*l* of the second source/drain pattern SD2, and may have a bottom surface located at a lower level than that of the top surface SD1*u* of the first source/drain pattern SD1. The bottom surface SD2*l* of the second source/drain pattern SD2 may be located at a level between those of the top and bottom surfaces of the first upper part UE1.

Referring to FIG. 6A, the first lower part LE1 may have a thickness t1 greater than a thickness t2 of the first upper part UE1. The thickness t2 of the first upper part UE1 may be greater than a thickness of each of the second and third upper parts UE2 and UE3.

Referring to FIG. 6B, the first upper part UE1 may have a thickness t2 greater than a thickness t1 of the first lower part LE1. A distance ds2 between the bottom surface CH2*l* of the second channel structure CH2 and the bottom surface SD2*l* of the second source/drain pattern SD2 may be greater than a distance ds1 between the bottom surface CH1*l* of the first channel structure CH1 and the bottom surface SD1*l* of the first source/drain pattern SD1.

Figure 7:
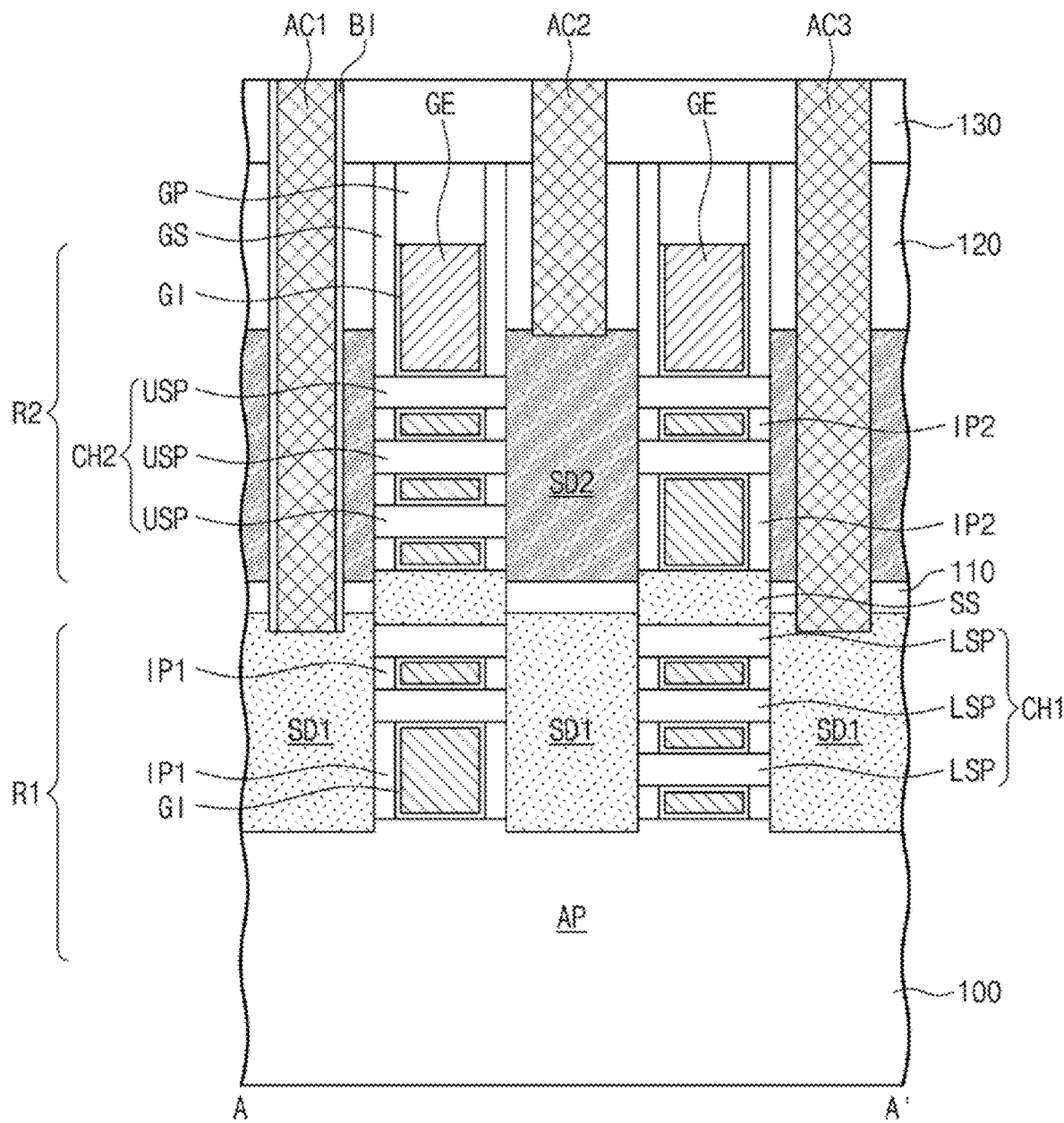
FIG. 7 illustrates a cross-sectional view taken along line A-A' of FIG. 1, showing a semiconductor device according to some example embodiments of the present inventive concepts.

FIG. 7 illustrates a cross-sectional view taken along line A-A' of FIG. 1, showing a semiconductor device according to some example embodiments of the present inventive concepts. There will be omission of detailed description about the same component explained above.

Referring to FIG. 7, a semiconductor device according to some example embodiments of the present inventive concepts may include active contacts AC1, AC2, and AC3 that are coupled to the first source/drain patterns SD1 and the second source/drain patterns SD2.

According to some example embodiments, a first active contact AC1 may be electrically connected to the first source/drain pattern SD1. For example, a third interlayer dielectric layer 130 may be provided on the second interlayer dielectric layer 120. The third interlayer dielectric layer 130 may cover a top surface of the gate spacer GS and a top surface of the gate capping pattern GP. The first active contact AC1 may penetrate the first, second, and third interlayer dielectric layers 110, 120, and 130 and the second source/drain pattern SD2, thereby being coupled to the first source/drain pattern SD1. The first active contact AC1 may be provided on its sidewall with a barrier dielectric layer BI that electrically insulates the first active contact AC1 from the second source/drain pattern SD2. According to some example embodiments, the first active contact AC1 may extend into the first source/drain pattern SD1. The first active contact AC1 may have a bottom surface lower than a top surface of the first source/drain pattern SD1.

According to some example embodiments, a second active contact AC2 may be electrically connected to the second source/drain pattern SD2. The second active contact AC2 may penetrate the second interlayer dielectric layer 120 and the third interlayer dielectric layer 130.

According to some example embodiments, a third active contact AC3 may be electrically connected to the first and second source/drain patterns SD1 and SD2 that vertically overlap each other. The third active contact AC3 may penetrate the first, second, and third interlayer dielectric layers 110, 120, and 130 and the second source/drain pattern SD2, thereby being coupled to the first source/drain pattern SD1. The third active contact AC3 may have a sidewall a portion of which is in contact with the second source/drain pattern SD2. The third active contact AC3 may extend into the first source/drain pattern SD1. The third active contact AC3 may have a bottom surface lower than a top surface of the first source/drain pattern SD1.

Figure 8A:
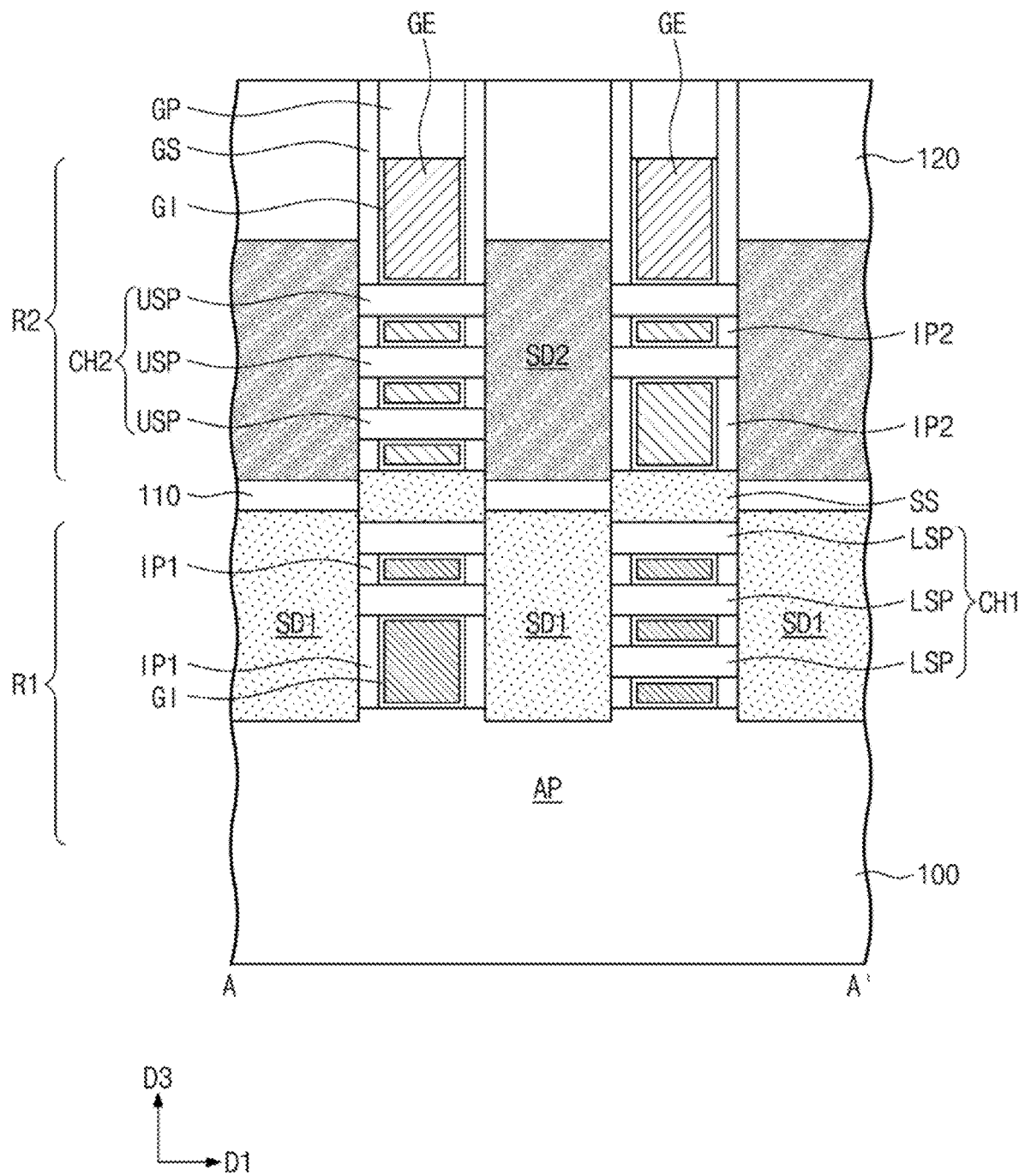
FIGS. 8A, 8B, and 8C illustrate cross-sectional views respectively taken along lines A-A', B-B', and C-C' of FIG. 1, showing a semiconductor device according to some example embodiments of the present inventive concepts.
Figure 8B:
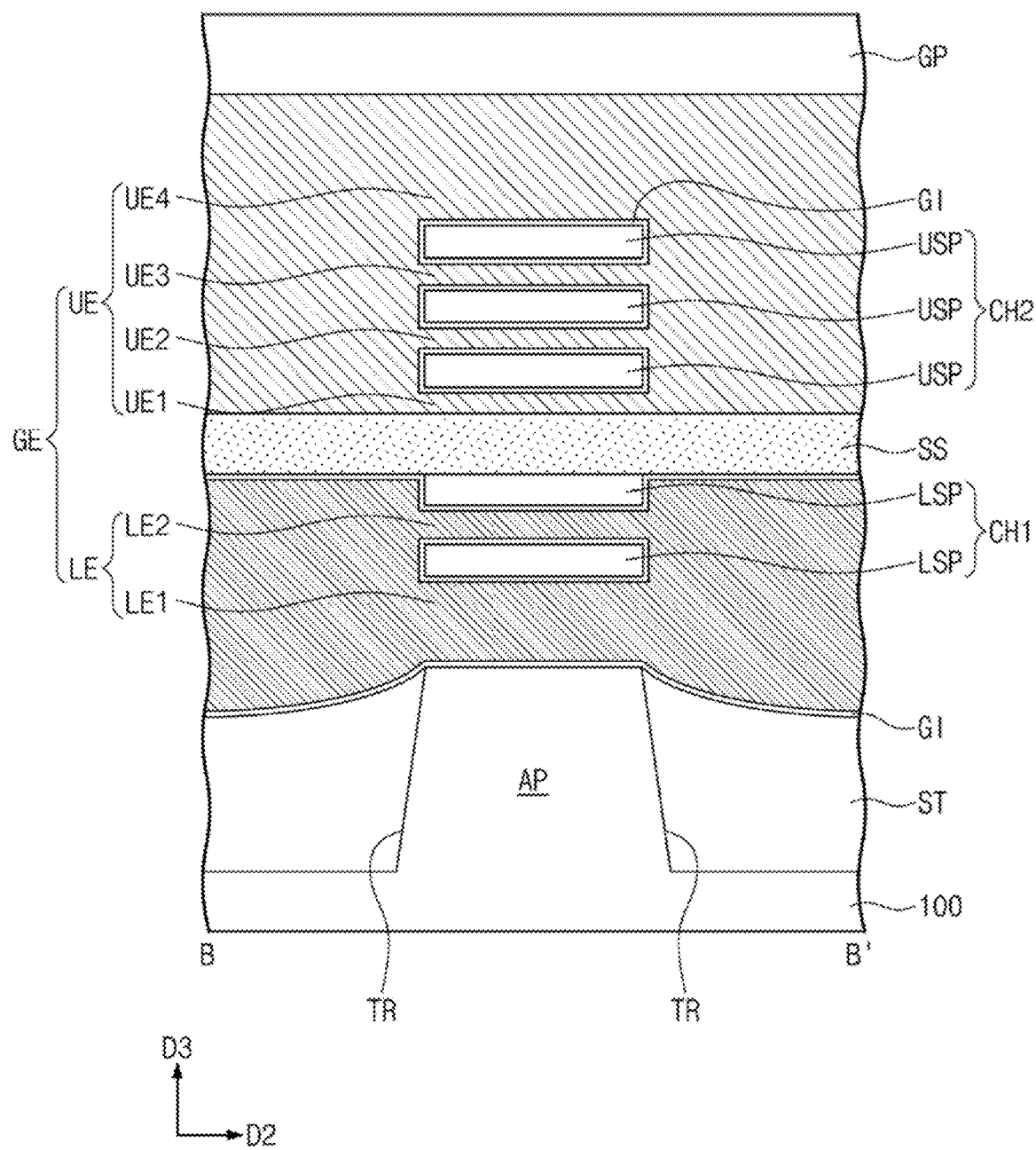
Figure 8C:
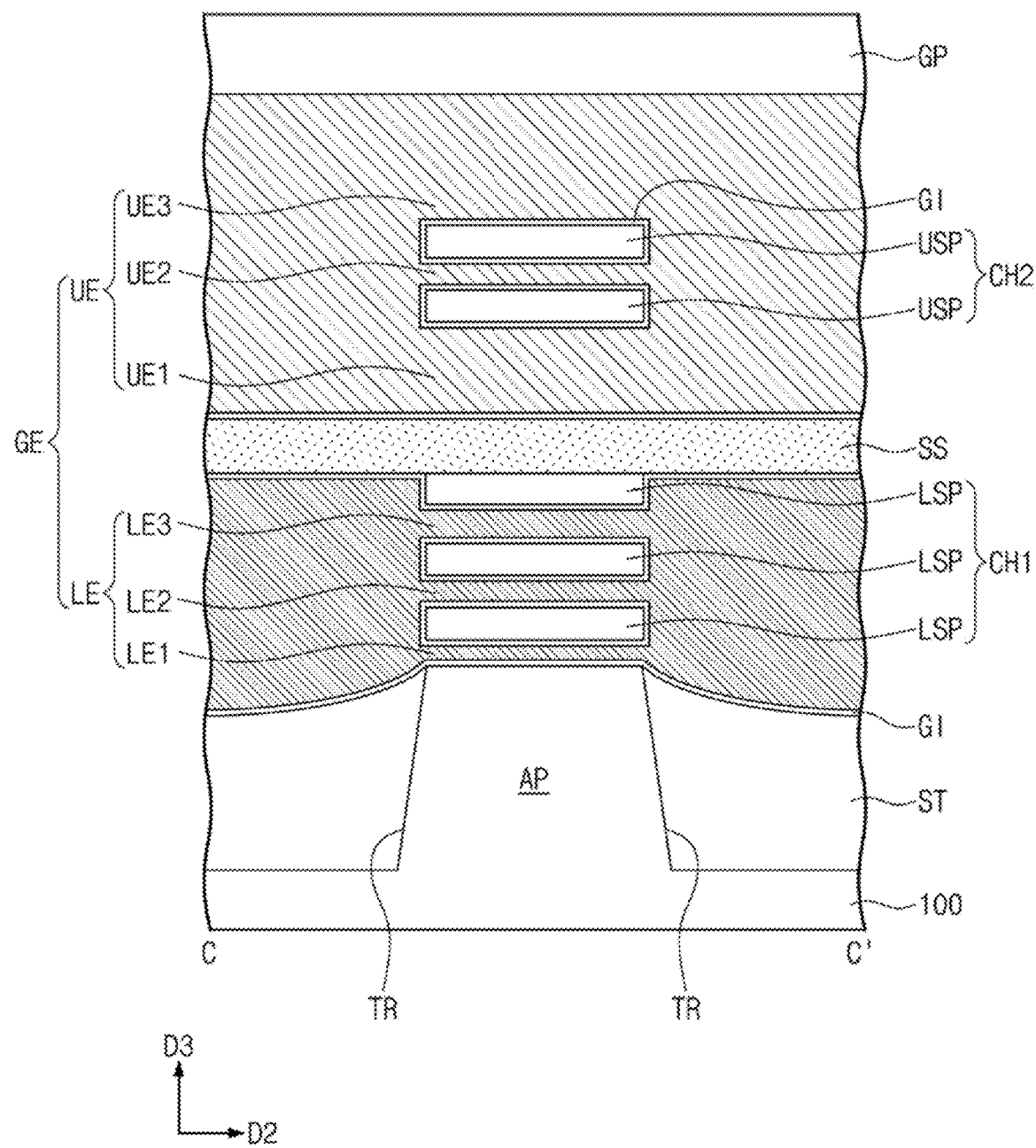

FIGS. 8A, 8B, and 8C illustrate cross-sectional views respectively taken along lines A-A', B-B', and C-C' of FIG. 1, showing a semiconductor device according to some example embodiments of the present inventive concepts. There will be omission of detailed description about the same component explained above.

Referring to FIGS. 8A to 8C, the separation dielectric pattern SS may extend in the second direction D2 to separate the lower and upper parts LE and UE of the gate electrode GE from each other in the third direction D3. The separation dielectric pattern SS may have a length in the second direction D2 greater than a length in the second direction D2 of each of the first and second channel structures CH1 and CH2. The lower and upper parts LE and UE of the gate electrode GE may be electrically insulated from each other and may be controlled separately from each other. For example, the gate electrode GE may not be shared by the transistor in the first region R1 and the transistor in the second region R2. The separation dielectric pattern SS may have top and bottom surfaces that are covered with the gate dielectric layer GI.

Figure 9A:
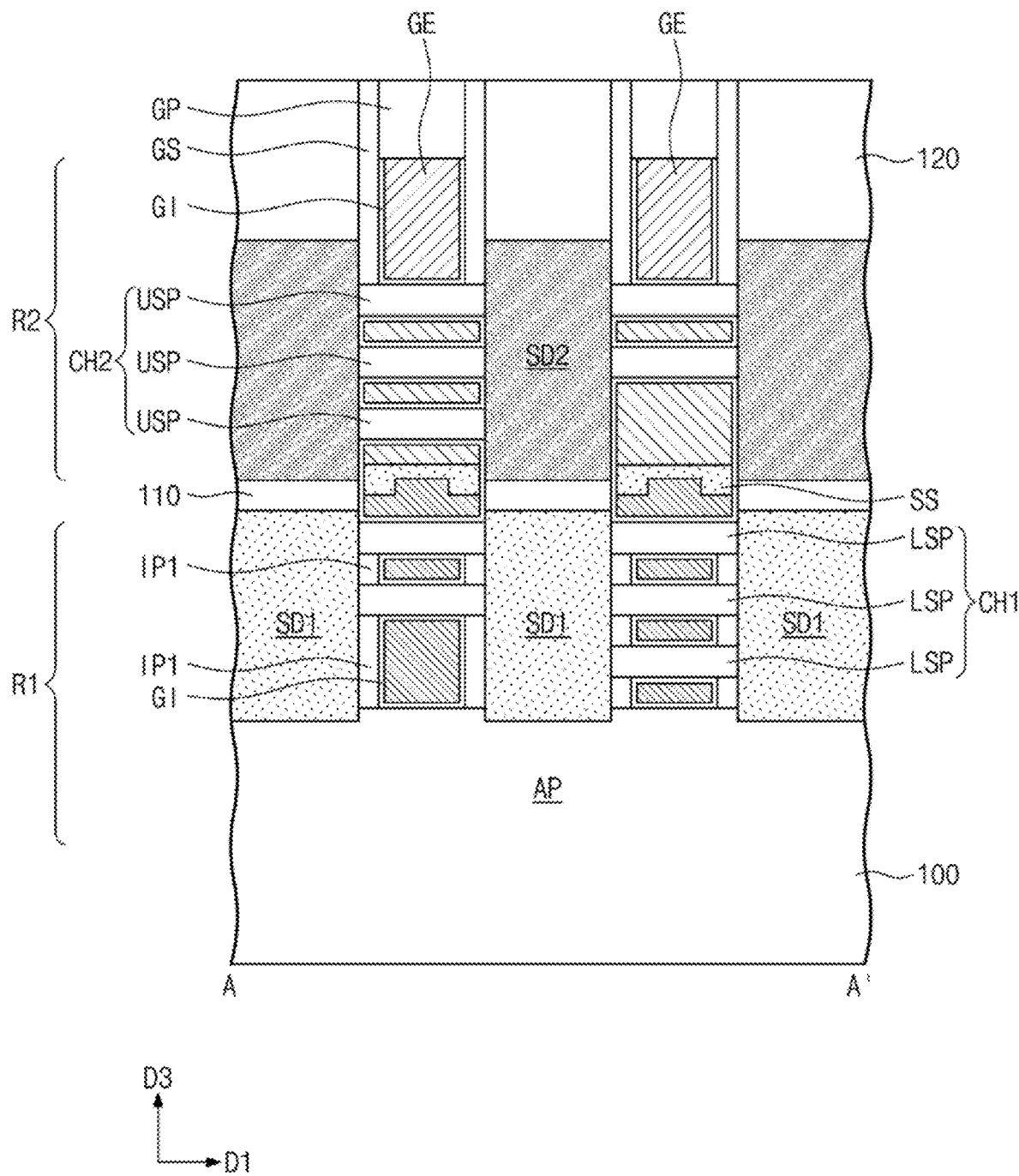
FIGS. 9A, 9B, and 9C illustrate cross-sectional views respectively taken along lines A-A', B-B', and C-C' of FIG. 1, showing a semiconductor device according to some example embodiments of the present inventive concepts.
Figure 9B:
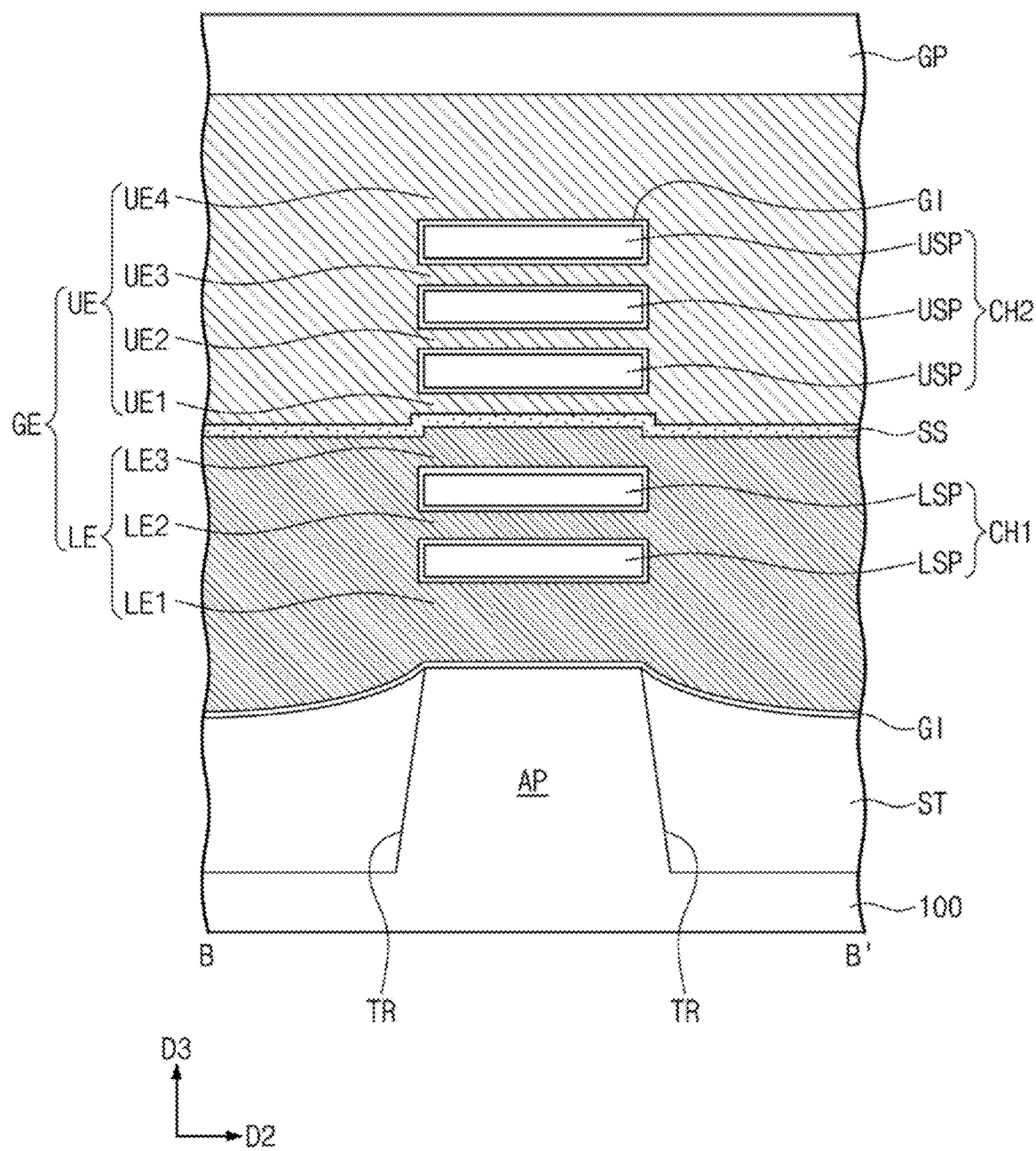
Figure 9C:
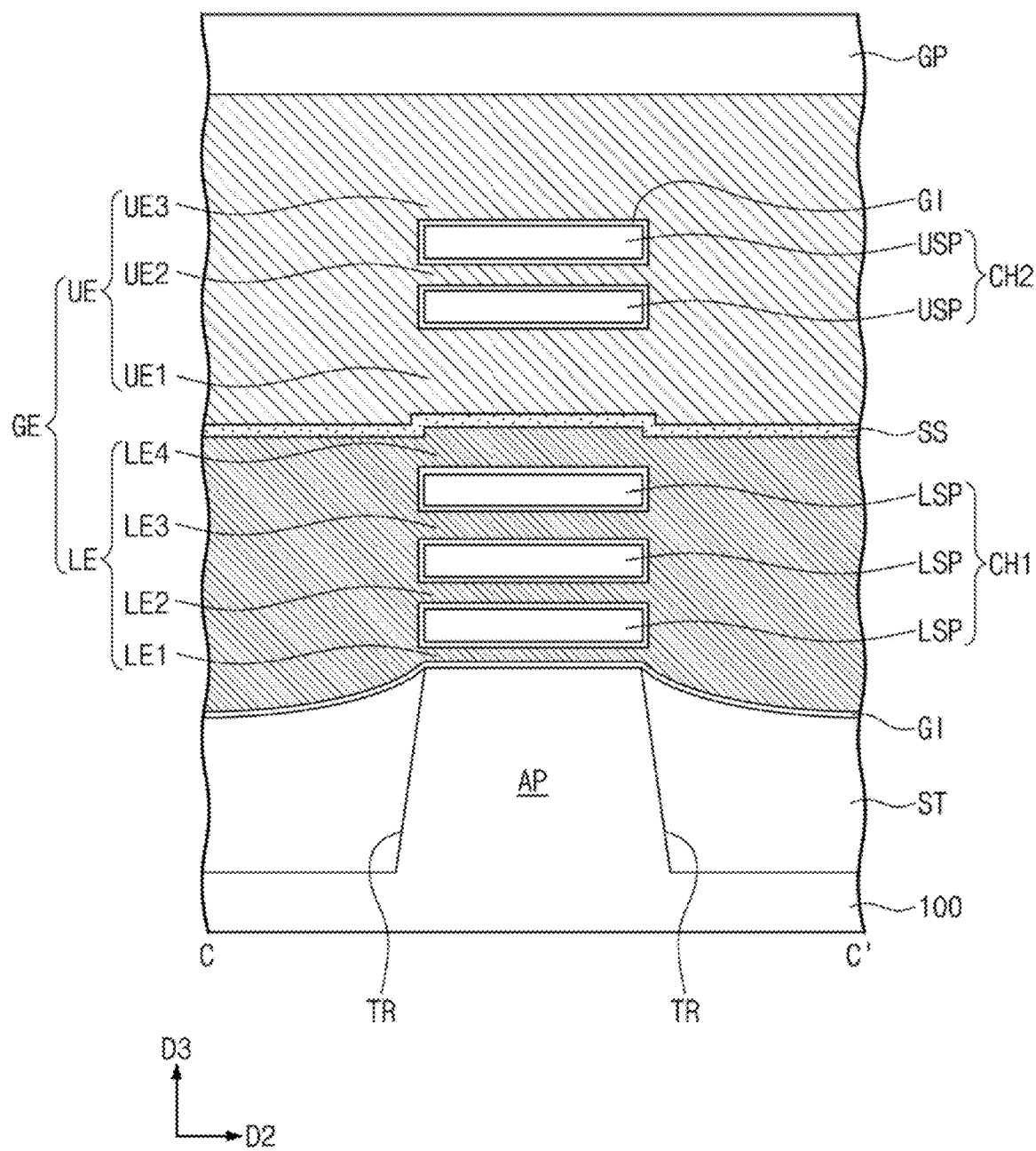

FIGS. 9A, 9B, and 9C illustrate cross-sectional views respectively taken along lines A-A', B-B', and C-C' of FIG. 1, showing a semiconductor device according to some example embodiments of the present inventive concepts. A description of the same technical features as those of the semiconductor device discussed above may be omitted, and the following will focus on a difference from the semiconductor device discussed with FIGS. 8A, 8B, and 8C.

Referring to FIGS. 9A to 9C, the first channel structure CH1 and the second channel structure CH2 may be provided therebetween with a portion of each of the lower and upper parts LE and UE included in the gate electrode GE. The separation dielectric pattern SS may extend in the second direction D2 between the lower part LE and the upper part UE. The lower and upper parts LE and UE of the gate electrode GE may be electrically insulated from each other by the separation dielectric pattern SS. The separation dielectric pattern SS may have a portion that is concavely recessed in a direction away from the substrate 100. The lower part LE of the gate electrode GE may fill the recessed portion of the separation dielectric pattern SS. For example, between the first channel structure CH1 and the second channel structure CH2, the lower part LE of the gate electrode GE may have a portion that protrudes in a direction away from the substrate 100.

Figure 10:
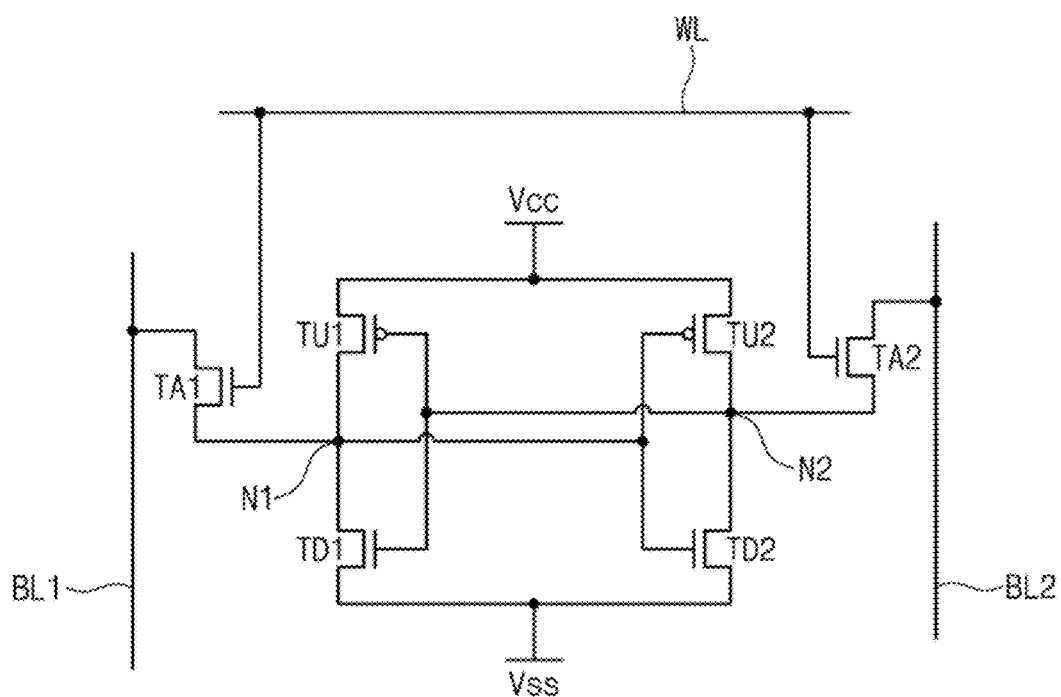
FIG. 10 illustrates a circuit diagram showing a static random access memory (SRAM) cell including a semiconductor device according to some example embodiments of the present inventive concepts.

FIG. 10 illustrates a circuit diagram showing a static random access memory (SRAM) cell including a semiconductor device according to some example embodiments of the present inventive concepts.

Referring to FIG. 10, a static random access memory (SRAM) cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors, and the first and second pull-down transistors TD1 and TD2 and the first and second access transistors TA1 and TA2 may be NMOS transistors.

A first node N1 may be connected to a first source/drain of the first pull-up transistor TU1 and a first source/drain of the first pull-down transistor TD1. The first node N1 may include the third active contact AC3 discussed with reference to FIG. 7. A power line Vcc may be connected to a second source/drain of the first pull-up transistor TU1, and a ground line Vss may be connected to a second source/drain of the first pull-down transistor TD1. The first pull-up transistor TU1 may have a gate electrically connected to a gate of the first pull-down transistor TD1. For example, the first pull-down transistor TD1 may correspond to one of the lower transistors discussed with reference to FIG. 2A, and the first pull-up transistor TU1 may correspond to the upper transistor that vertically overlaps the one lower transistor and shares the gate electrode GE with the one lower transistor.

The first pull-up transistor TU1 and the first pull-down transistor TD1 may constitute a first inverter. The first inverter may have an input terminal that corresponds to the connected gates of the first pull-up and pull-down transistors TU1 and TD1, and may have an output terminal that corresponds to the first node N1.

A second node N2 may be connected to a first source/drain of the second pull-up transistor TU2 and a first source/drain of the second pull-down transistor TD2. The second pull-up transistor TU2 may have a second source/drain connected to the power line Vcc, and the second pull-down transistor TD2 may have a second source/drain connected to the ground line Vss. The second pull-up transistor TU2 and the second pull-down transistor TD2 may have their gates that are electrically connected to each other. The second pull-up transistor TU2 and the second pull-down transistors TD2 may constitute a second inverter. The second inverter may have an input terminal that corresponds to the connected gates of the second pull-up and pull-down transistors TU2 and TD2, and may have an output terminal that corresponds to the second node N2.

The first and second inverters may be connected to each other to constitute a latch structure. In this configuration, the gates of the first pull-up and pull-down transistors TU1 and TD1 may be electrically connected to the second node N2, and the gates of the second pull-up and pull-down transistors TU2 and TD2 may be electrically connected to the first node N1. The first access transistor TA1 may have a first source/drain connected to the first node N1 and a second source/drain connected to a first bit line BL1. The second access transistor TA2 may have a first source/drain connected to the second node N2 and a second source/drain connected to a second bit line BL2. The first and second access transistors TA1 and TA2 may have their gates electrically connected to a word line WL. The semiconductor device according to some example embodiments of the present inventive concepts may increase an access disturb margin of the SRAM cell.

FIGS. 11, 12, 13, and 14 and FIGS. 15A, 16A, 17A, 18A, 19A, 20A, and 21A illustrate cross-sectional views taken along line A-A' of FIG. 1, showing a method of fabricating a semiconductor device according to some example embodiments of the present inventive concepts. FIG. 15B illustrates a cross-sectional view taken along line B-B' of FIG. 1, showing a method of fabricating a semiconductor device according to some example embodiments of the present inventive concepts. FIGS. 16B, 17B, 18B, 19B, 20B, and 21B illustrate cross-sectional views taken along line D-D' of FIG. 1, showing a method of fabricating a semiconductor device according to some example embodiments of the present inventive concepts.

Figure 11:
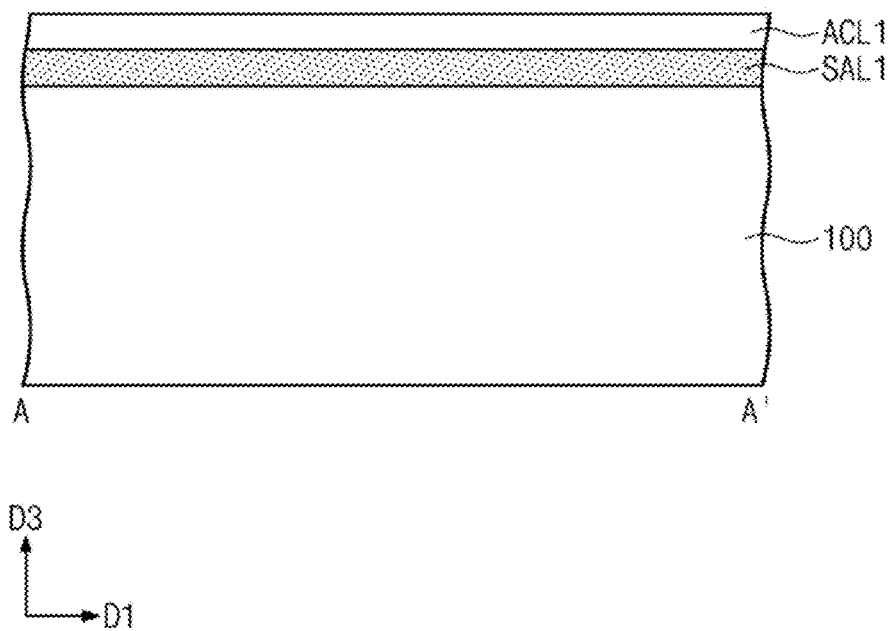
FIGS. 11, 12, 13, and 14 and FIGS. 15A, 16A, 17A, 18A, 19A, 20A, and 21A illustrate cross-sectional views taken along line A-A' of FIG. 1, showing a method of fabricating a semiconductor device according to some example embodiments of the present inventive concepts.

Referring to FIG. 11, a first sacrificial layer SAL1 and a first active layer ACL1 may be sequentially formed on a substrate 100. The first sacrificial layer SAL1 may include one of silicon (Si), germanium (Ge), and silicon-germanium (SiGe), and the first active layer ACL1 may include another of silicon (Si), germanium (Ge), and silicon-germanium (SiGe). For example, the first sacrificial layer SAL1 may include silicon-germanium (SiGe), and the first active layer ACL1 may include silicon (Si). A concentration of germanium (Ge) contained in the first sacrificial layer SAL1 may range from about 10 at % to about 30 at %.

Figure 12:
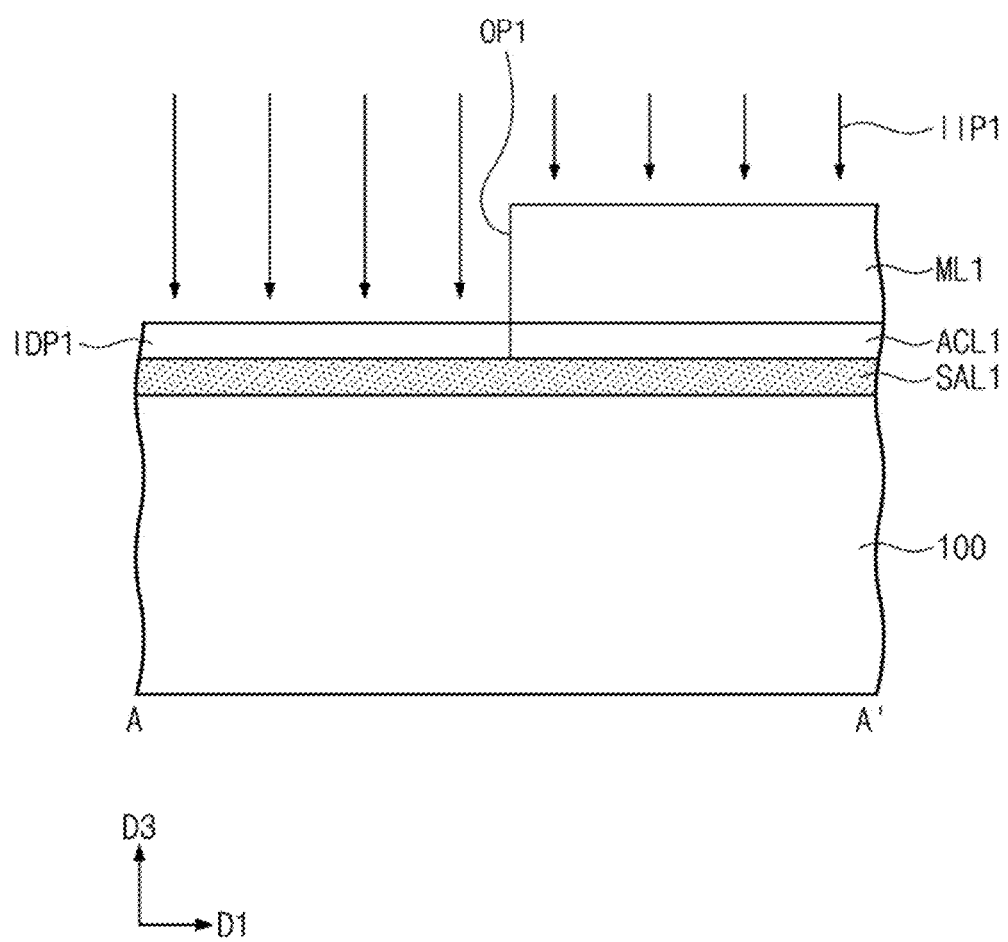

Referring to FIG. 12, a first mask pattern ML1 may be formed on the first active layer ACL1. The first mask pattern ML1 may have an opening OP1 that partially expose a top surface of the first active layer ACL1. Afterwards, the first mask pattern ML1 may be used to perform a first ion implantation process IIP1 to form a first ion implantation pattern IDP1. During the first ion implantation process IIP1, the first active layer ACL1 may be provided therein with impurities through the opening OP1 of the first mask pattern ML1. A portion of the first active layer ACL1 may be formed into the first ion implantation pattern IDP1. The first ion implantation pattern IDP1 may have an etch selectivity with respect to the first active layer ACL1. The first ion implantation pattern IDP1 may have no etch selectivity with respect to the first sacrificial layer SAL1. For example, the first ion implantation pattern IDP1 may be etched with the same etchant used for etching the first sacrificial layer SAL1, and the first active layer ACL1 may not be etched with the etchant. According to some example embodiments, a germanium (Ge) element may be used to perform the first ion implantation process IIP1 and may be included in the first ion implantation pattern IDP1. After the first ion implantation pattern IDP1 is formed, the first mask pattern ML1 may be removed.

Figure 13:
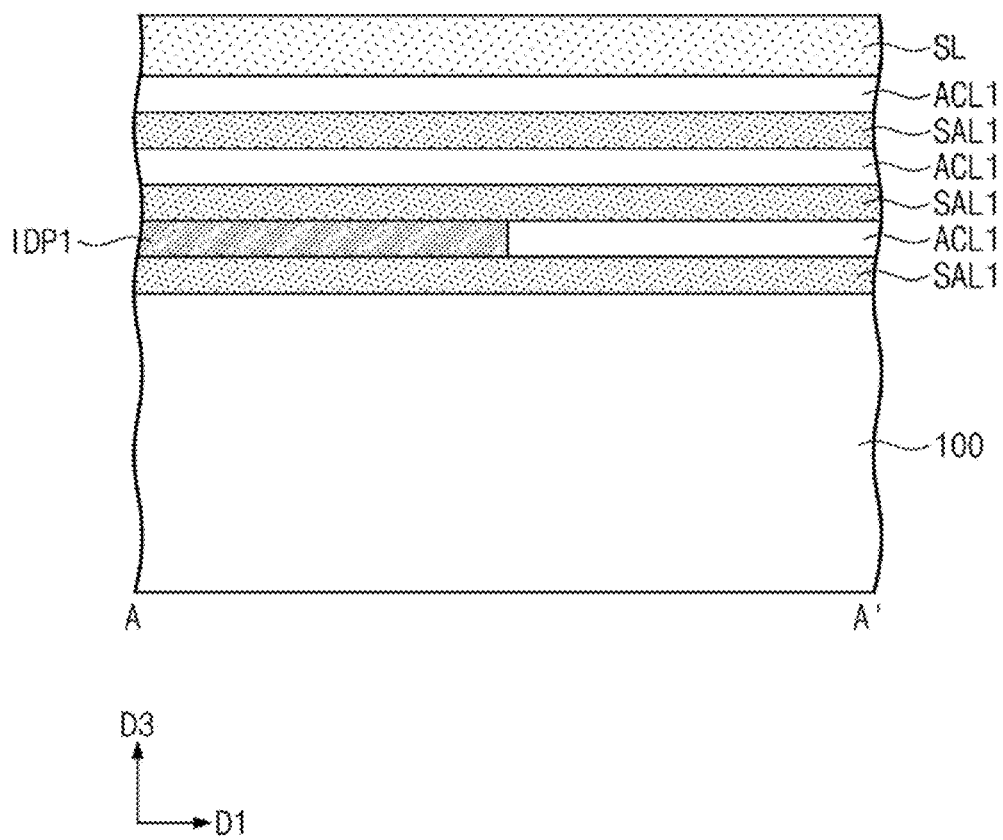

Referring to FIG. 13, another first sacrificial layer SAL1 and another first active layer ACL1 may be alternately and repeatedly stacked on the first active layer ACL1 in which the first ion implantation pattern IDP1 is formed. After that, a separation dielectric layer SL may be formed on a top surface of the first active layer ACL1. The separation dielectric layer SL may be formed to have a thickness greater than that of each of the first sacrificial layer SAL1 and the first active layer ACL1. The separation dielectric layer SL may include a material having an etch selectivity with respect to the first sacrificial layer SAL1, the first active layer ACL1, and the first ion implantation pattern IDP1. For example, the separation dielectric layer SL may include at least one selected from SiON, SiCN, SiCON, and SiN. According to some example embodiments, the separation dielectric layer SL and the substrate 100 may be provided therebetween with three first active layers ACL1 and three first sacrificial layers SAL1 that are alternately stacked with each other.

Figure 14:
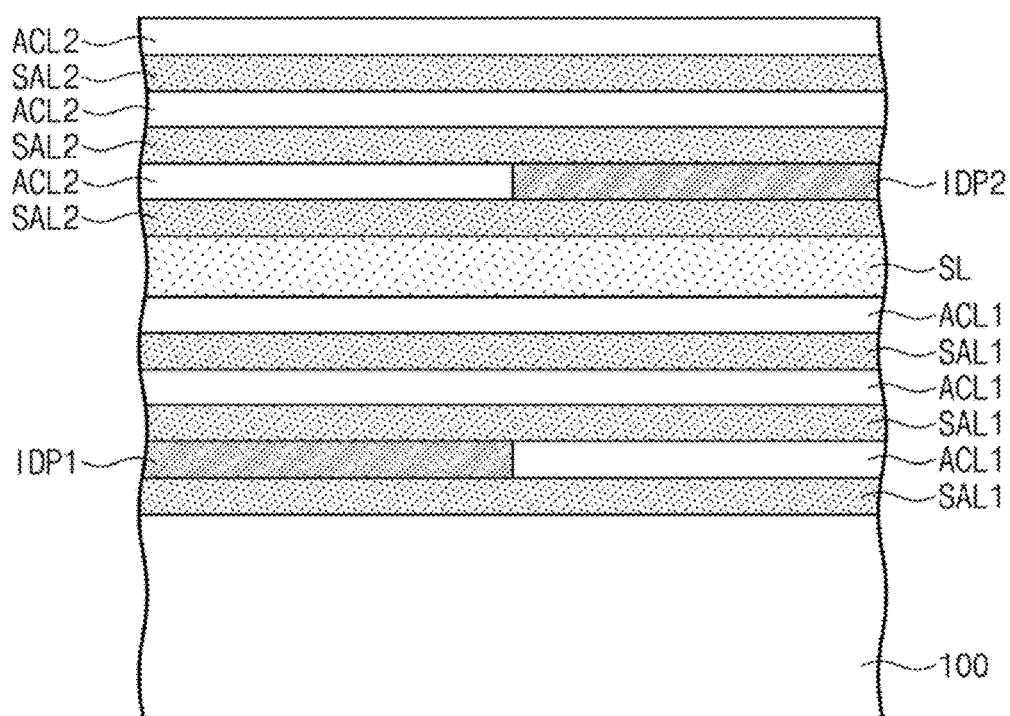

Referring to FIG. 14, a second sacrificial layer SAL2 and a second active layer ACL2 may be alternately and repeatedly stacked on a top surface of the separation dielectric layer SL. After the formation of a lowermost one of the second active layers ACL2, the lowermost second active layer ACL2 may undergo a second ion implantation process to form a second ion implantation pattern IDP2. The second ion implantation process may be formed by a method similar to that used for performing the first ion implantation process IIP1. The number of the second active layers ACL2 may be the same as that of the first active layers ACL1, and the number of the second sacrificial layers SAL2 may be the same as that of the first sacrificial layers SAL1.

Figure 15A:
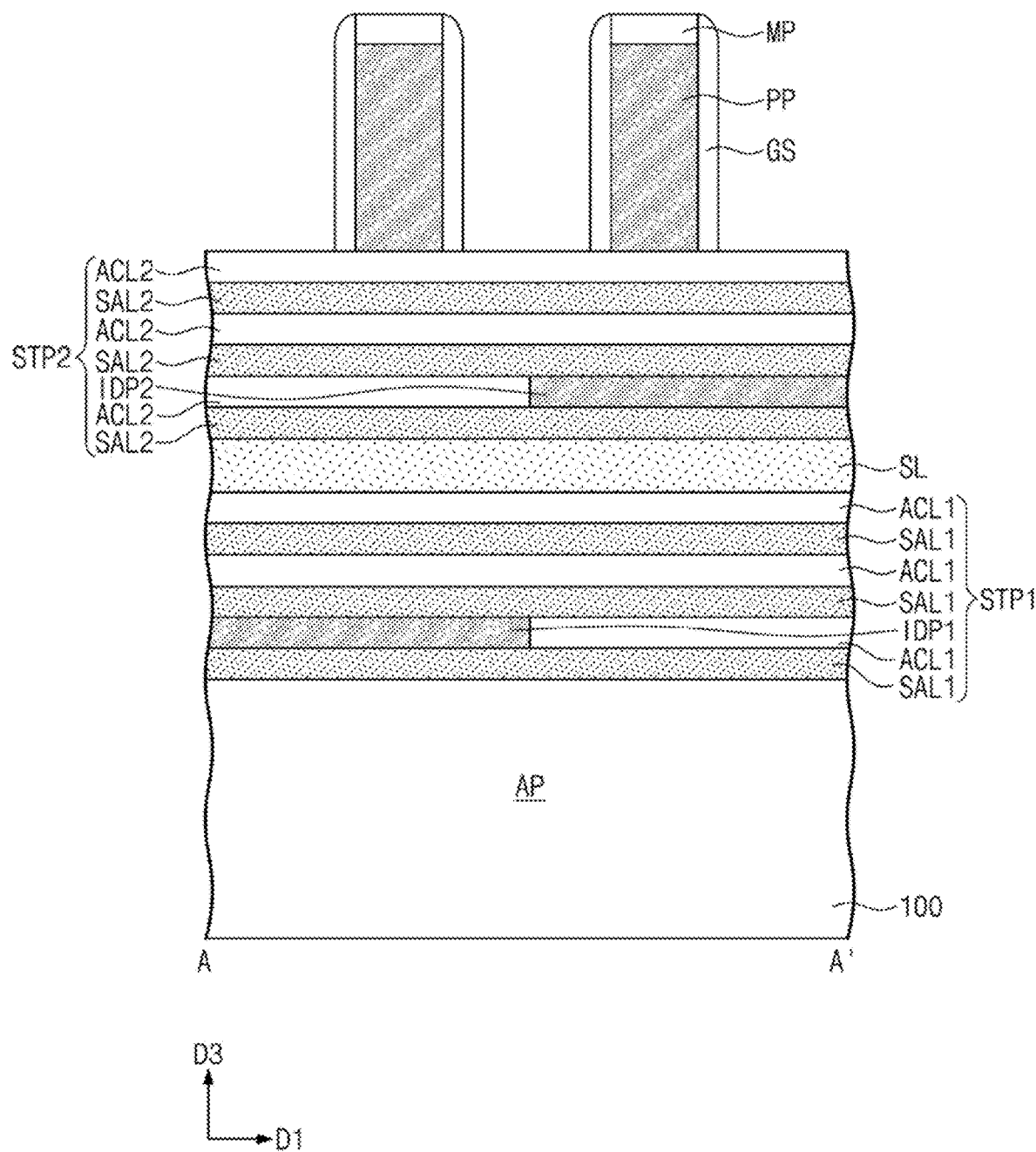
Figure 15B:
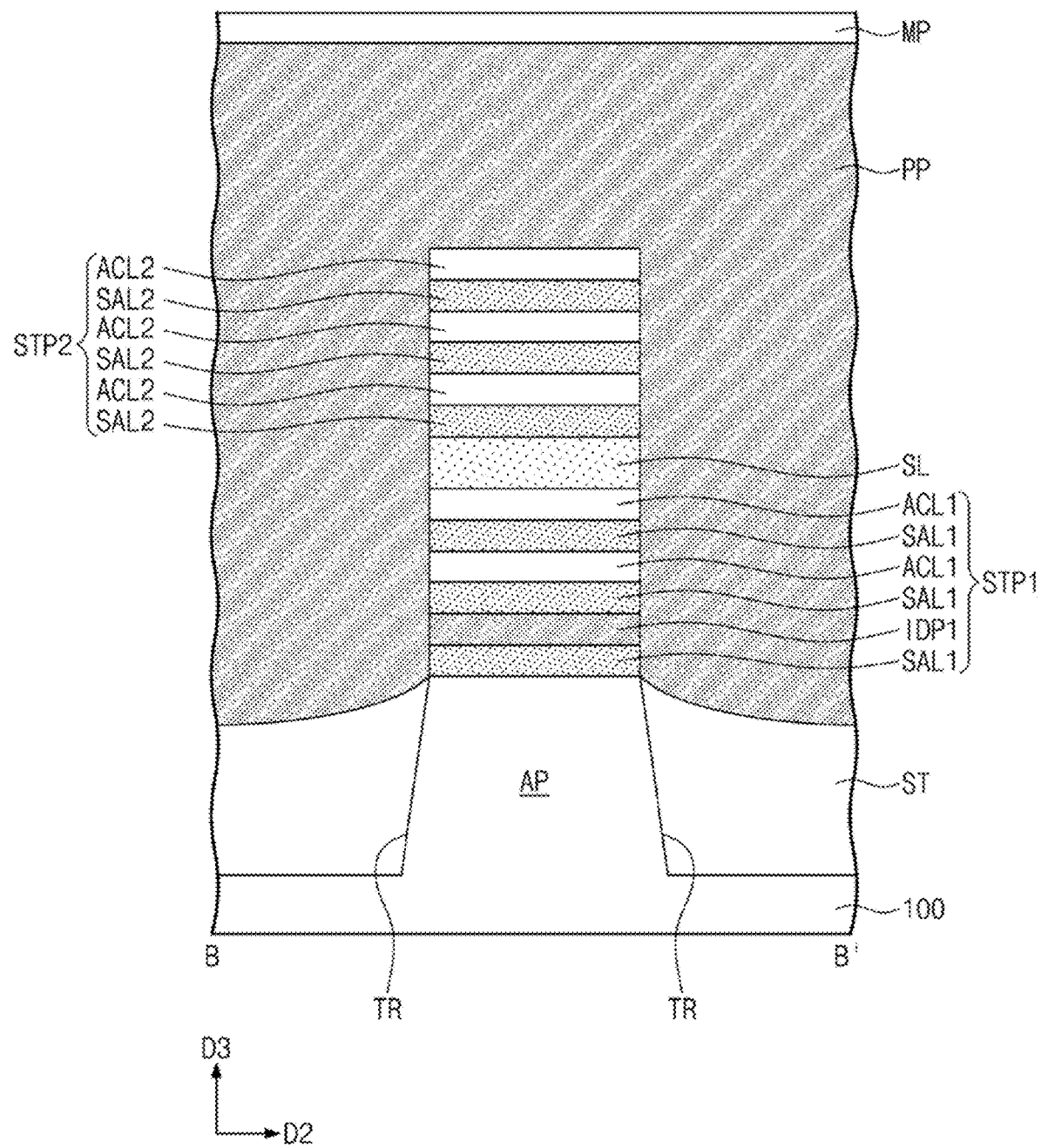
FIG. 15B illustrates a cross-sectional view taken along line B-B' of FIG. 1, showing a method of fabricating a semiconductor device according to some example embodiments of the present inventive concepts.

Referring to FIGS. 15A and 15B, an active pattern AP, a lower stack pattern STP1, and an upper stack pattern STP2 may be formed on the substrate 100. For example, an etching mask pattern may be formed on an uppermost one of the second active layers ACL2. The etching mask pattern may have a linear or bar shape that extends in a first direction D1. A patterning process that uses the etching mask pattern may be performed to form trenches TR. The trenches TR may be formed on an upper portion of the substrate 100, extending in the first direction D1. The trenches TR may define an active pattern AP therebetween. According to some example embodiments, the trenches TR may have a width in a second direction D2 that decreases with decreasing distance (e.g., in the third direction D3) from a bottom surface of the substrate 100, and the active pattern AP may have a width in the second direction D2 that increases with decreasing distance (e.g., in the third direction D3) from the bottom surface of the substrate 100.

The lower stack pattern STP1 and the upper stack pattern STP2 may be formed overlapping the active pattern AP. The lower stack pattern STP1 and the upper stack pattern STP2 may be etched together with the substrate 100, thereby extending in the first direction D1. The lower stack pattern STP1 may include the first sacrificial layers SAL1 and the first active layers ACL1 that are alternately stacked on a top surface of the active pattern AP. The upper stack pattern STP2 may include the second sacrificial layers SAL2 and the second active layers ACL2 that are alternately stacked on the top surface of the separation dielectric layer SL.

A device isolation layer ST may be formed to fill the trenches TR. For example, a dielectric layer may be formed on an entire surface of the substrate 100 to cover the first and second active patterns AP1 and AP2 and the lower and upper stack patterns STP1 and STP2. The dielectric layer may be recessed until the lower and upper stack patterns STP1 and STP2 are exposed, thereby forming the device isolation layer ST. The device isolation layer ST may include a dielectric material, such as a silicon oxide layer. Neither the lower stack pattern STP1 nor the upper stack pattern STP2 may be covered with the device isolation layer ST. For example, the lower stack pattern STP1 may protrude vertically and upwardly from the device isolation layer ST.

Thereafter, sacrificial patterns PP may be formed on the substrate 100, running across the lower and upper stack patterns STP1 and STP2. Each of the sacrificial patterns PP may be formed to have a linear or bar shape that extends in the second direction D2. The sacrificial patterns PP may be arranged at a certain pitch along the first direction D1. For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include, for example, polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multi-layer including at least two selected from SiCN, SiCON, and SiN. Each of the sacrificial patterns PP may vertically overlap one of the first ion implantation pattern IDP1 and the second ion implantation pattern IDP2. For example, the sacrificial pattern PP that vertically overlaps the first ion implantation pattern IDP1 may not vertically overlap the second ion implantation pattern IDP2. The first ion implantation pattern IDP1 and the second ion implantation pattern IDP2 may vertically overlap a space between a pair of sacrificial patterns PP that are adjacent to each other in the first direction D1.

Figure 16A:
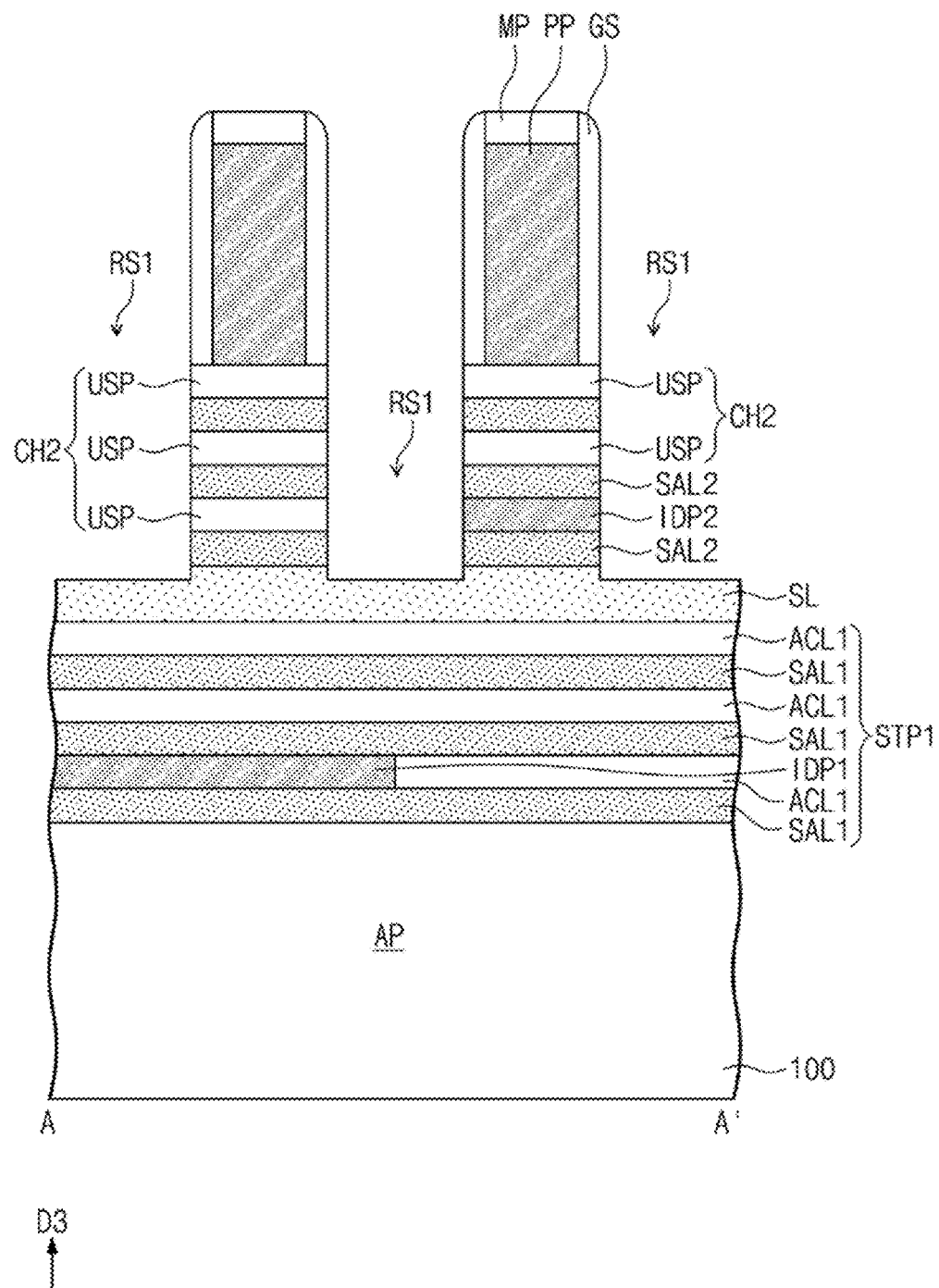
Figure 16B:
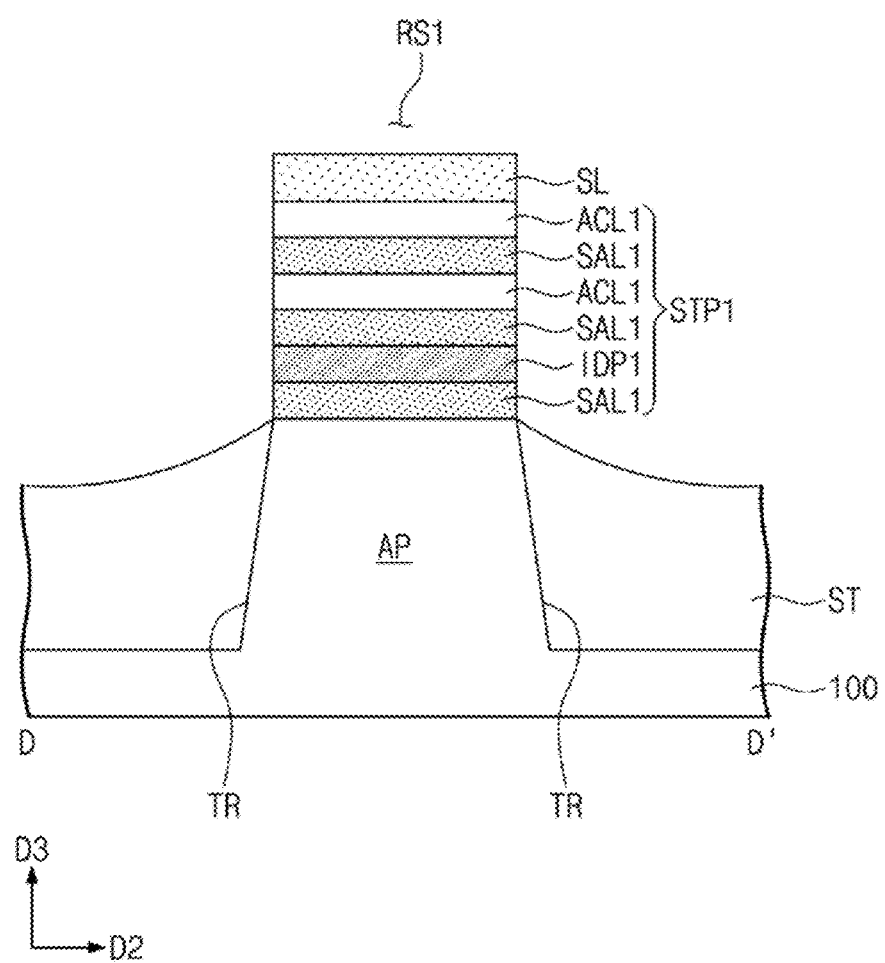
FIGS. 16B, 17B, 18B, 19B, 20B, and 21B illustrate cross-sectional views taken along line D-D' of FIG. 1, showing a method of fabricating a semiconductor device according to some example embodiments of the present inventive concepts.

Referring to FIGS. 16A and 16B, first recesses RS1 may be formed in the upper stack pattern STP2. While the first recesses RS1 are formed, the device isolation layer ST on opposite sides of the active pattern AP may also be recessed (see FIG. 16B).

For example, the hardmask patterns MP and the gate spacers GS may be used as an etching mask to etch the upper stack pattern STP2 on the active pattern AP to thereby form the first recesses RS1. The first recesses RS1 may be formed to extend toward a top surface of the substrate 100 from spaces on sidewalls of the sacrificial patterns PP.

A plurality of first recesses RS1 may be arranged in the first direction D1. A second channel structure CH2 including upper semiconductor patterns USP may be formed between a pair of first recesses RS1. The upper semiconductor patterns USP may be stacked alternately with and vertically spaced apart from the second sacrificial layers SAL2. One of the second channel structures CH2 may be formed on a top surface of the second ion implantation pattern IDP2. The second channel structure CH2 disposed on the top surface of the second ion implantation pattern IDP2 may have the upper semiconductor patterns USP the number of which is less than the number of the upper semiconductor patterns USP in the second channel structure CH2 that is not disposed on the top surface of the second ion implantation pattern IDP2. A lowermost one of the upper semiconductor patterns USP in the second channel structure CH2 that is not disposed on the top surface of the second ion implantation pattern IDP2 may be located at the same level as that of the second ion implantation pattern IDP2.

Figure 17A:
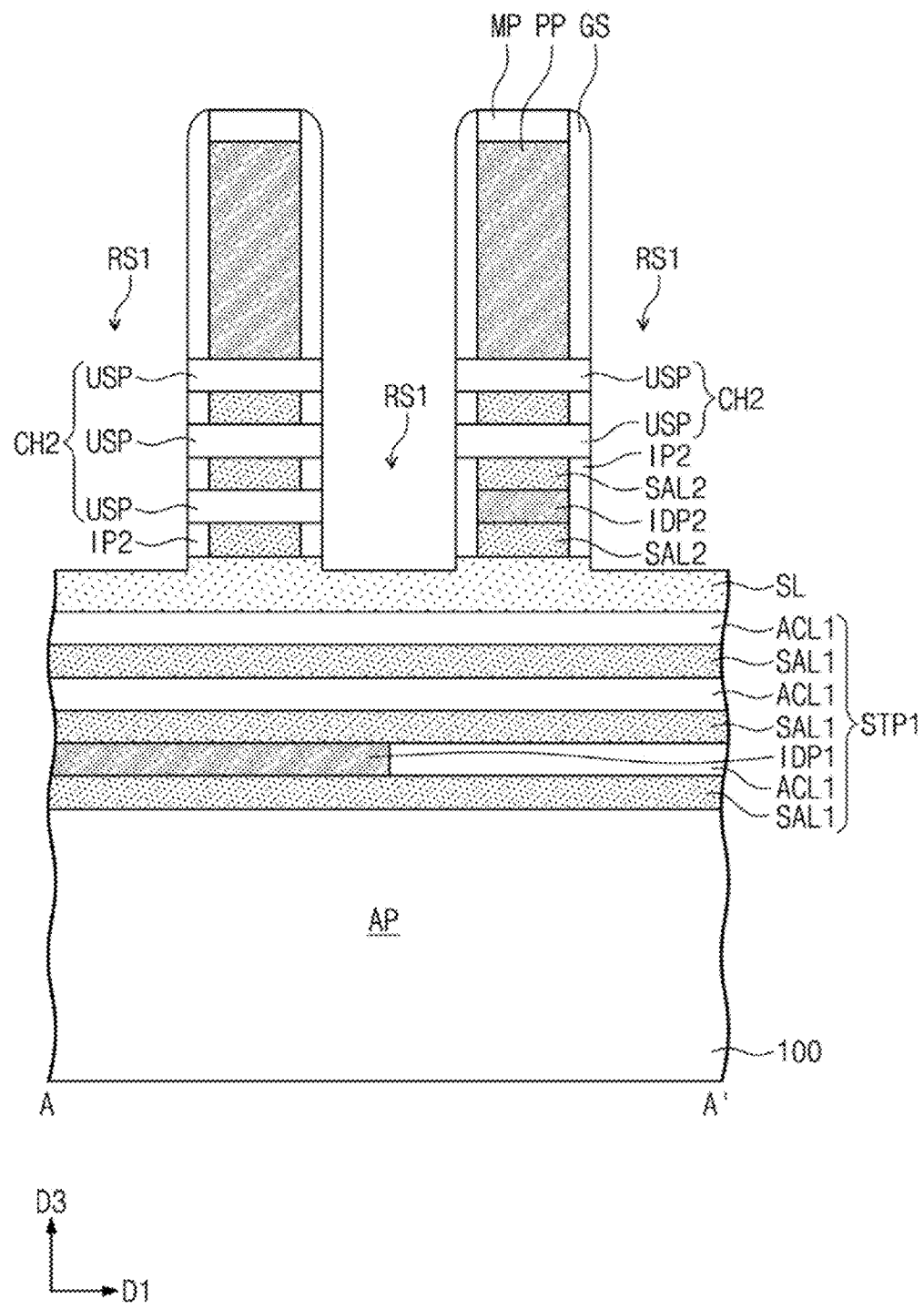
Figure 17B:
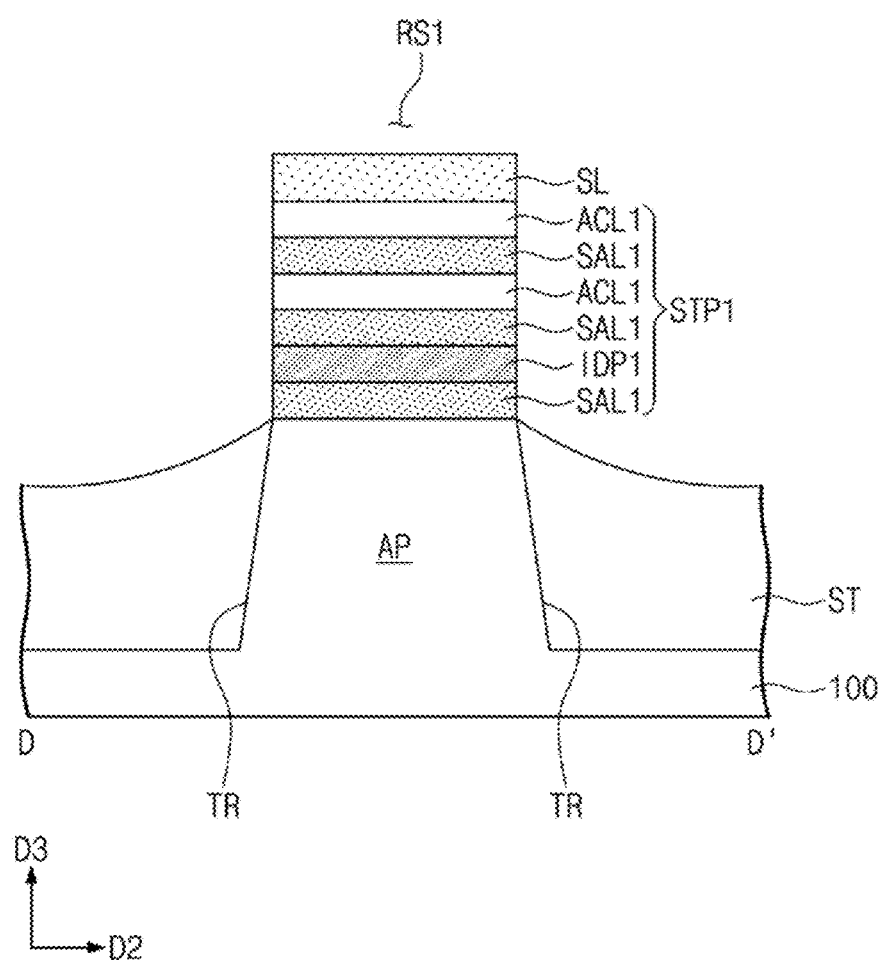

Referring to FIGS. 17A and 17B, upper inner spacers IP2 may be formed on lateral surfaces of the second sacrificial layers SAL2. For example, the lateral surfaces of the second sacrificial layers SAL2 exposed to the first recess RS1 may be partially etched. A dielectric layer may be formed to fill spaces where the second sacrificial layers SAL2 are partially removed. The dielectric layer may be etched to form the upper inner spacers IP2 that are vertically spaced apart from each other. The upper inner spacers IP2 may be formed between the upper semiconductor patterns USP, and may have their sidewalls aligned with those of the upper semiconductor patterns USP. During the removal of the lateral surfaces of the second sacrificial layers SAL2, lateral surfaces of the second ion implantation pattern IDP2 may also be partially etched. Therefore, at least a pair of upper inner spacers IP2 may be formed on the lateral surfaces of the second ion implantation pattern IDP2. The upper inner spacer IP2 on the lateral surface of the second ion implantation pattern IDP2 may extend onto a lateral surface of the upper semiconductor pattern USP on the top surface of the second ion implantation pattern IDP2 and onto a lateral surface of the upper semiconductor pattern USP on a bottom surface of the second ion implantation pattern IDP2. The upper inner spacer IP2 on the lateral surface of the second ion implantation pattern IDP2 may have a length in the third direction D3 greater than lengths in the third direction D3 of other upper inner spacers IP2.

Figure 18A:
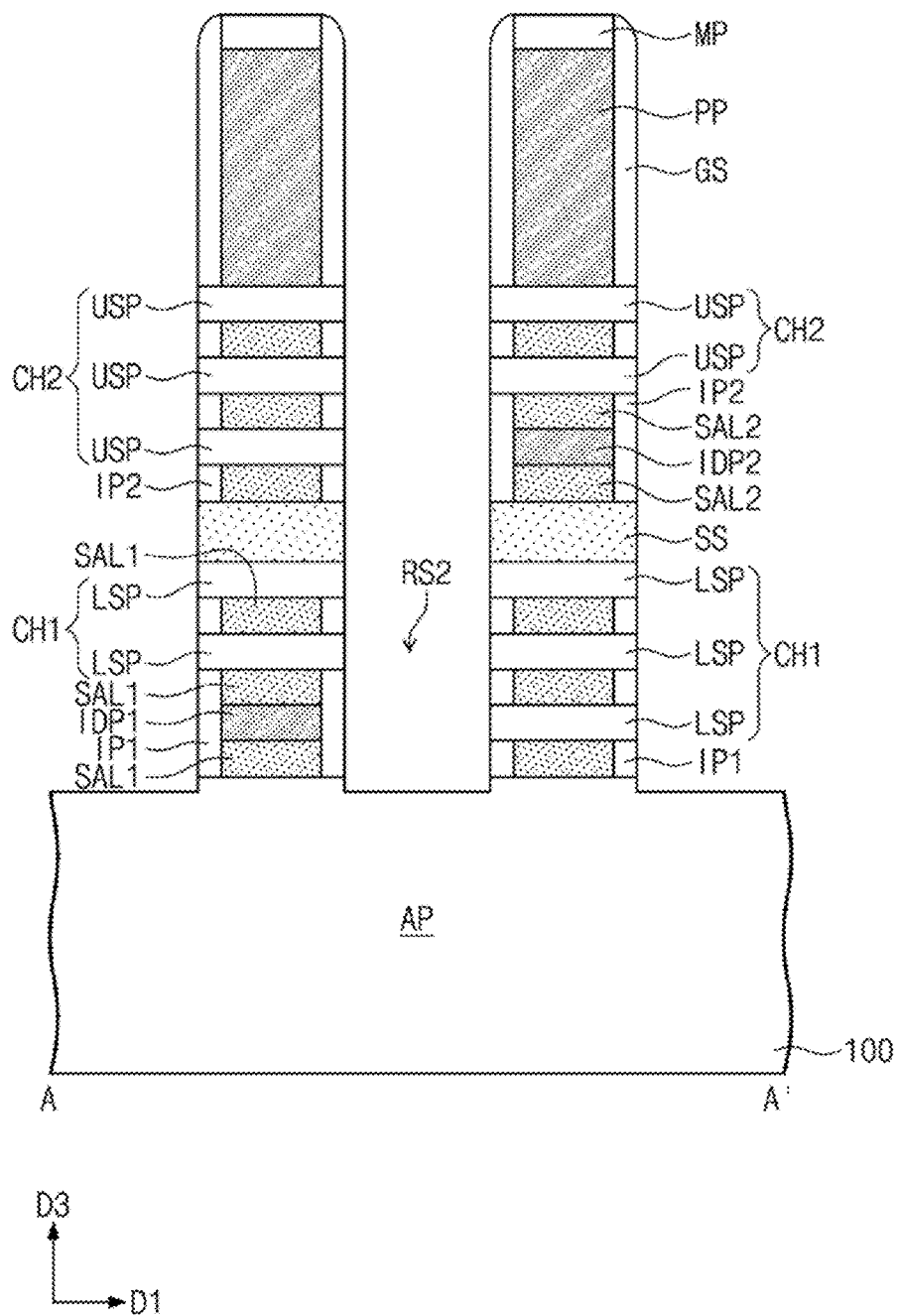
Figure 18B:
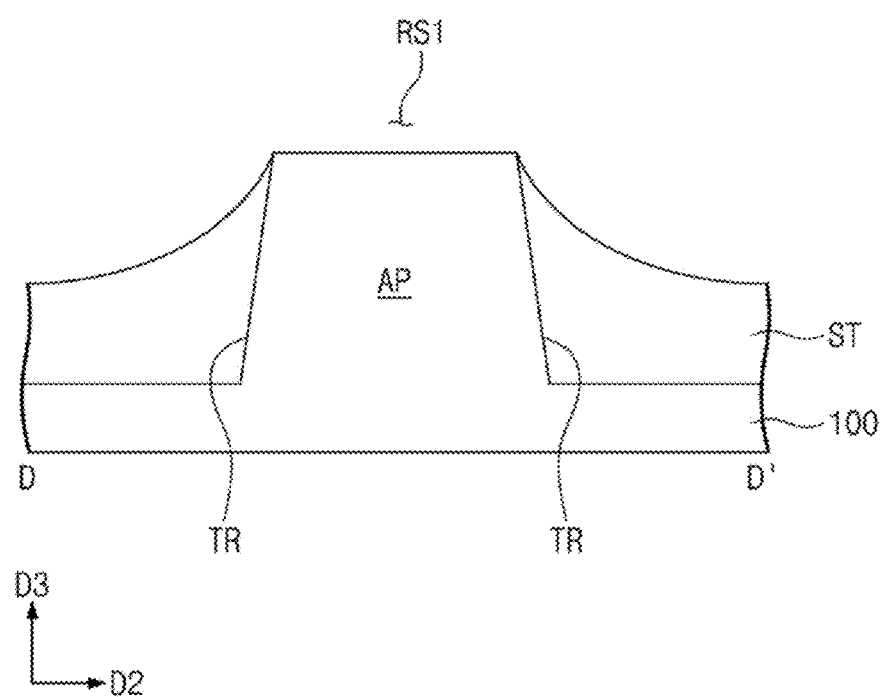

Referring to FIGS. 18A and 18B, the first recesses RS1 may further be recessed to form second recesses RS2. While the second recesses RS2 are formed, the device isolation layer ST on opposite sides of the active pattern AP may also be recessed.

For example, the hardmask patterns MP and the gate spacers GS may be used as an etching mask to etch the lower stack pattern STP1 on the active pattern AP to thereby form the second recesses RS2. The second recesses RS2 may have their bottom surfaces located at a lower level than that of an uppermost surface of the active pattern AP. The bottom surfaces of the second recesses RS2 may be located at a lower level than that of a bottom surface of a lowermost one of the first sacrificial layers SAL1.

A first channel structure CH1 including lower semiconductor patterns LSP may be formed between the second recesses RS2. The lower semiconductor patterns LSP may be stacked alternately with and vertically spaced apart from the first sacrificial layers SAL1. One of the first channel structures CH1 may be formed on a top surface of the first ion implantation pattern IDP1. The first channel structure CH1 disposed on the top surface of the first ion implantation pattern IDP1 may have the lower semiconductor patterns LSP the number of which is less than the number of the lower semiconductor patterns LSP in the first channel structure CH1 that is not disposed on the top surface of the first ion implantation pattern IDP1. A lowermost one of the lower semiconductor patterns LSP in the first channel structure CH1 that is not disposed on the top surface of the first ion implantation pattern IDP1 may be located at the same level as that of the first ion implantation pattern IDP1.

Thereafter, lower inner spacers IP1 may be formed on lateral surfaces of the first sacrificial layers SAL1. For example, the lateral surfaces of the first sacrificial layers SAL1 exposed to the second recess RS2 may be partially etched. A dielectric layer may be formed to fill spaces where the first sacrificial layers SAL1 are partially removed. The dielectric layer may be etched to form the lower inner spacers IP1 that are vertically spaced apart from each other. The lower inner spacers IP1 may be formed between the lower semiconductor patterns LSP, and may have their sidewalls aligned with those of the lower semiconductor patterns LSP. During the removal of the lateral surfaces of the first sacrificial layers SAL1, lateral surfaces of the first ion implantation pattern IDP1 may also be partially etched. Therefore, at least a pair of lower inner spacers IP1 may be formed on the lateral surfaces of the first ion implantation pattern IDP1. The lower inner spacer IP1 on the lateral surface of the first ion implantation pattern IDP1 may extend onto a lateral surface of the lateral semiconductor pattern LSP on the top surface of the first ion implantation pattern IDP1 and onto a lateral surface of the lower semiconductor pattern LSP on a bottom surface of the first ion implantation pattern IDP1. The lower inner spacer IP1 on the lateral surface of the first ion implantation pattern IDP1 may have a length in the third direction D3 greater than lengths in the third direction D3 of other lower inner spacers IP1.

According to some example embodiments, the formation of the lower inner spacers IP1 may be omitted.

Figure 19A:
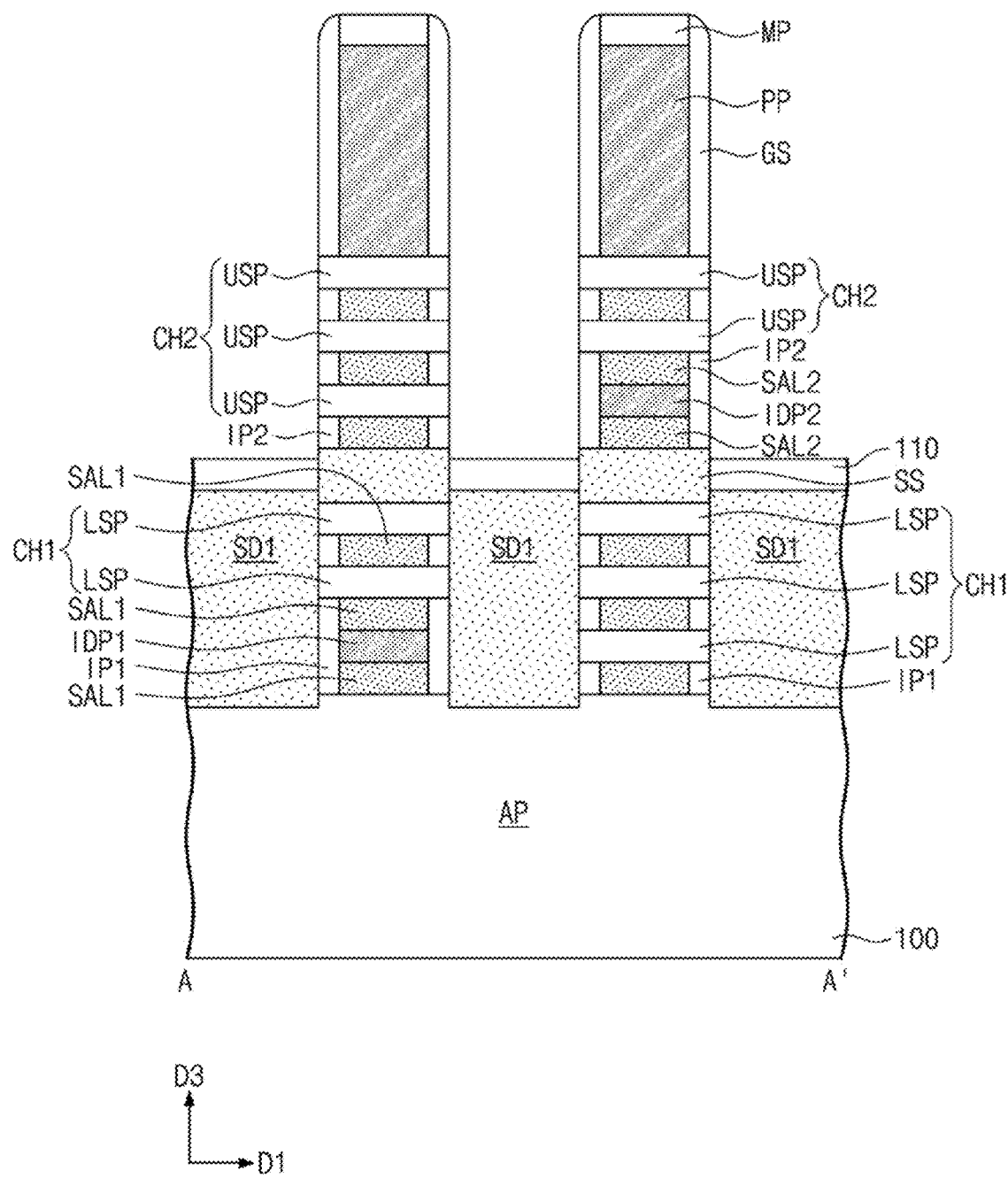
Figure 19B:
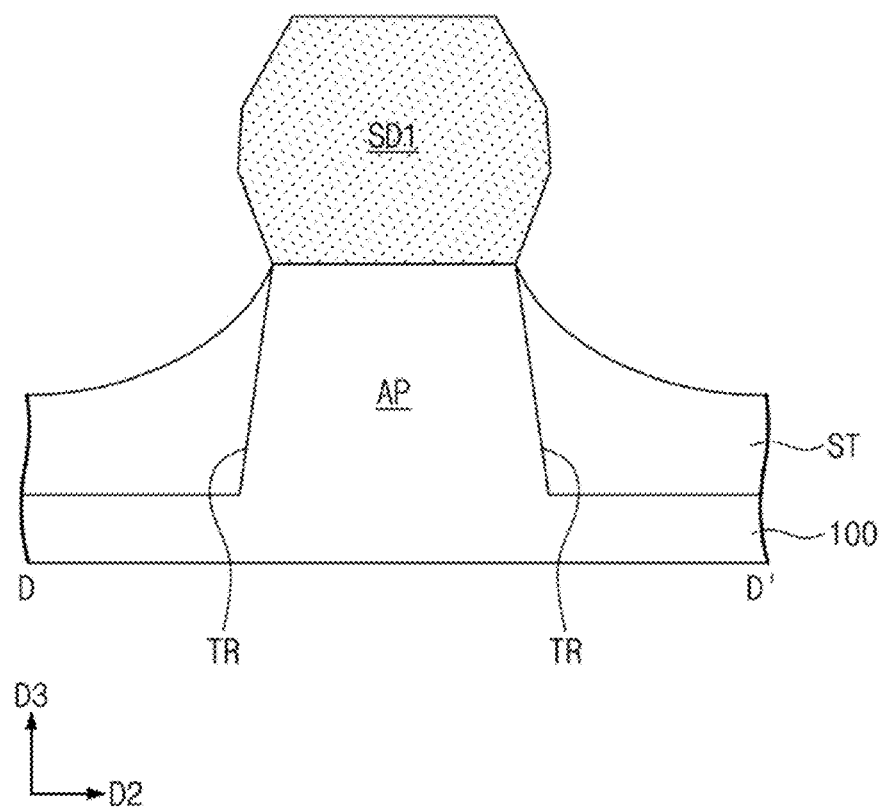

Referring to FIGS. 19A and 19B, first source/drain patterns SD1 may be correspondingly formed in the second recesses RS2. For example, the first source/drain patterns SD1 may be formed by performing a first selective epitaxial growth (SEG) process in which the sidewalls of the lower semiconductor patterns LSP and the top surface of the active pattern AP are used as seeds. For example, the first SEG process may include chemical vapor deposition (CVD) or molecular beam epitaxy (MBE).

Alternatively, the first source/drain patterns SD1 may include the same semiconductor element (e.g., Si) as that of the substrate 100. The first source/drain patterns SD1 may be doped to have a first conductivity type (e.g., n-type).

According to some example embodiments, before the formation of the first source/drain patterns SD1, a barrier layer may be formed to cover the sidewalls of the upper semiconductor patterns USP. The sidewalls of the upper semiconductor patterns USP may not be exposed during the first SEG process. Therefore, the first source/drain pattern SD1 may be selectively grown a lower portion of the second recess RS2. The barrier layer may be formed either simultaneously with or after the formation of the upper inner spacers IP2 discussed with reference to FIGS. 17A and 17B.

Figure 20A:
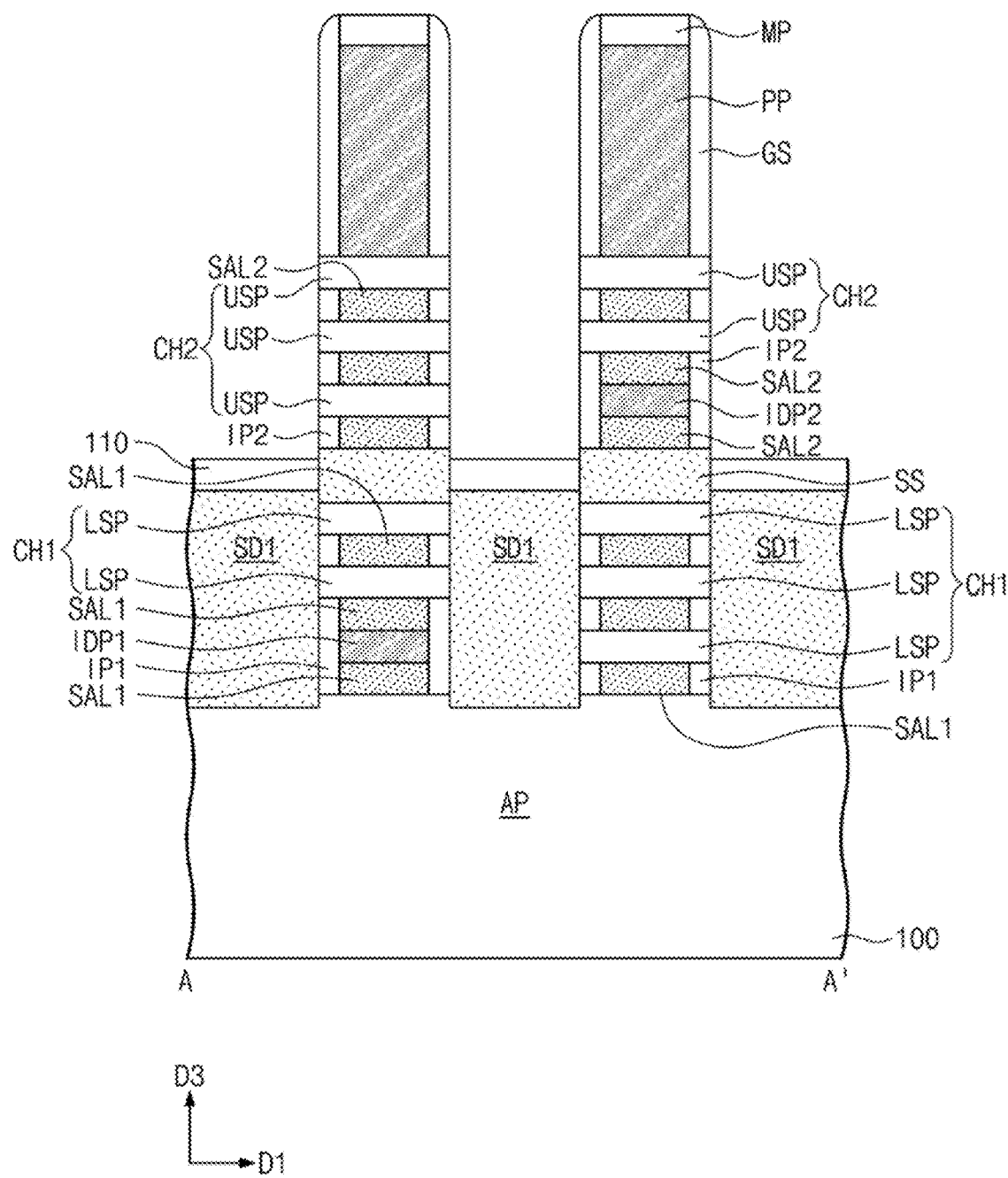
Figure 20B:
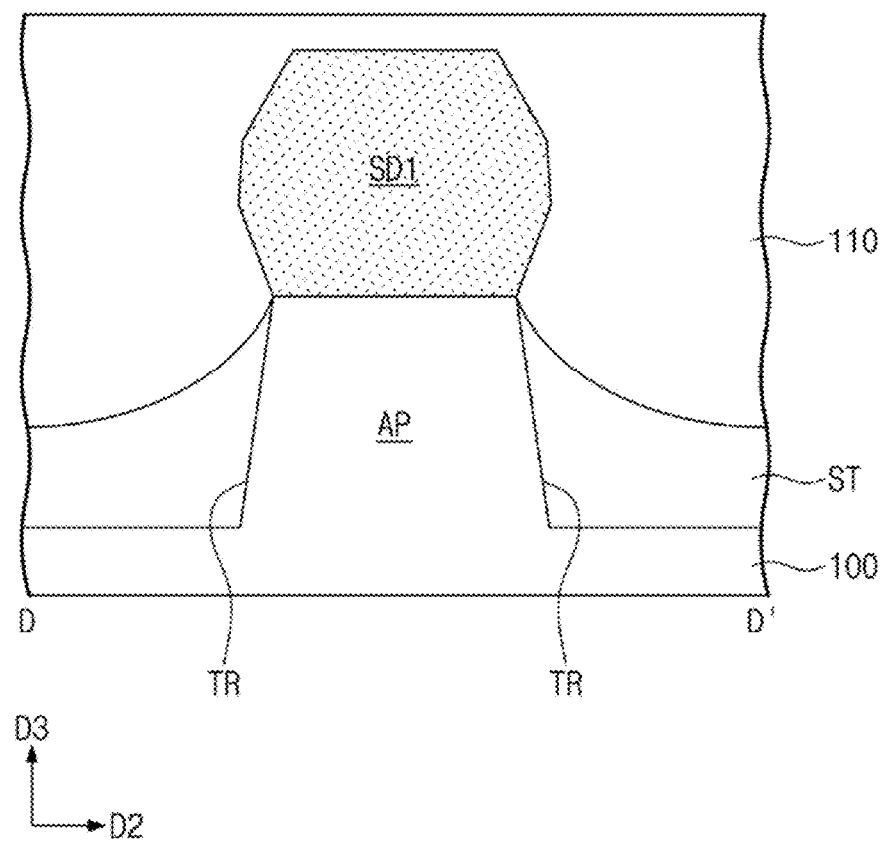

Referring to FIGS. 20A and 20B, a first interlayer dielectric layer 110 may be formed on the substrate 100. The formation of the first interlayer dielectric layer 110 may include forming a dielectric layer that covers the first source/drain patterns SD1 and etching the dielectric layer until the dielectric layer has a top surface located at a level not higher than that of top surfaces of the separation dielectric patterns SS. The first interlayer dielectric layer 110 may have a planarized top surface. The first interlayer dielectric layer 110 may have a bottom surface that covers a top surface of the device isolation layer ST. The bottom surface of the first interlayer dielectric layer 110 may convexly protrude toward a bottom surface of the trench TR.

Figure 21A:
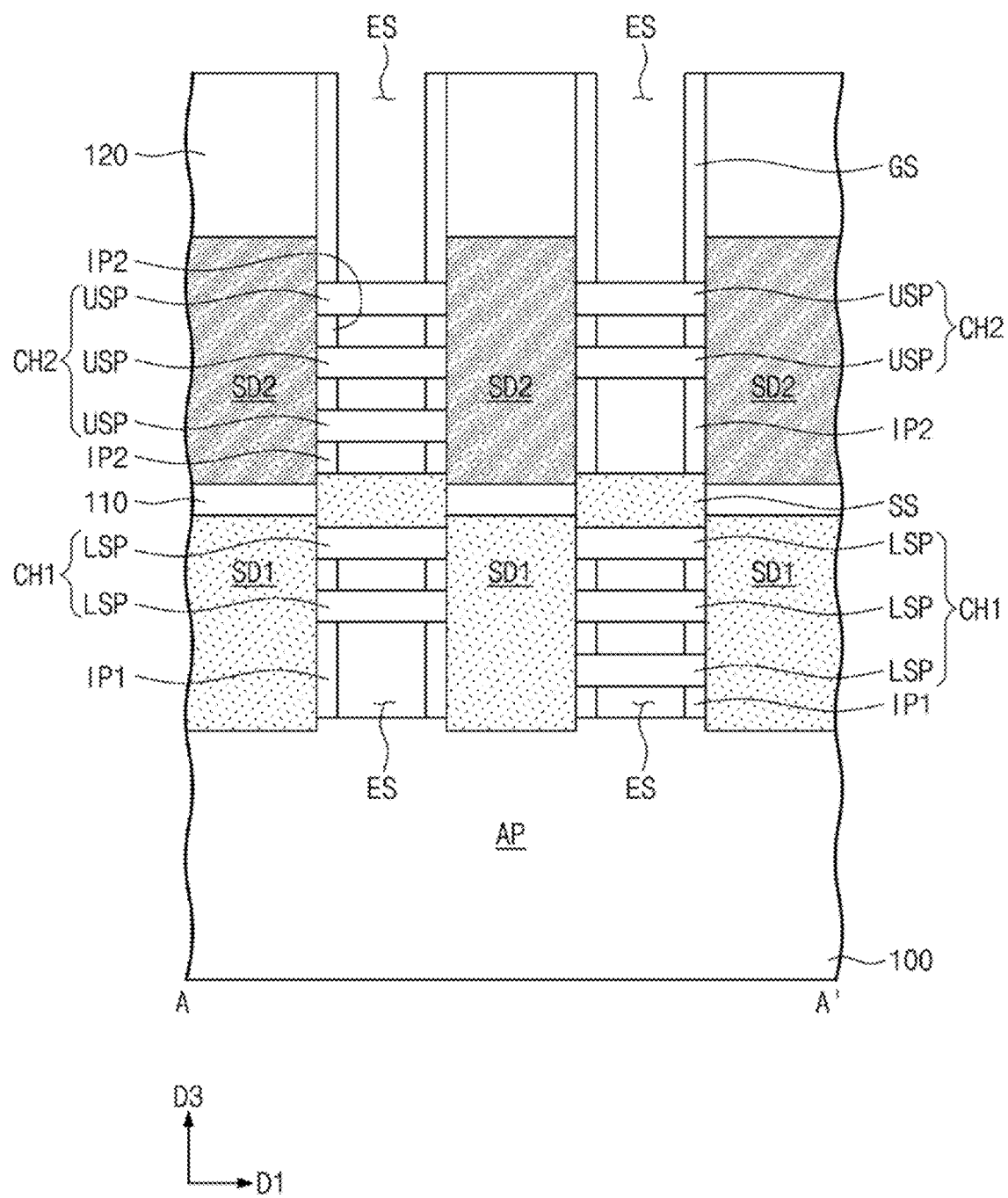
Figure 21B:
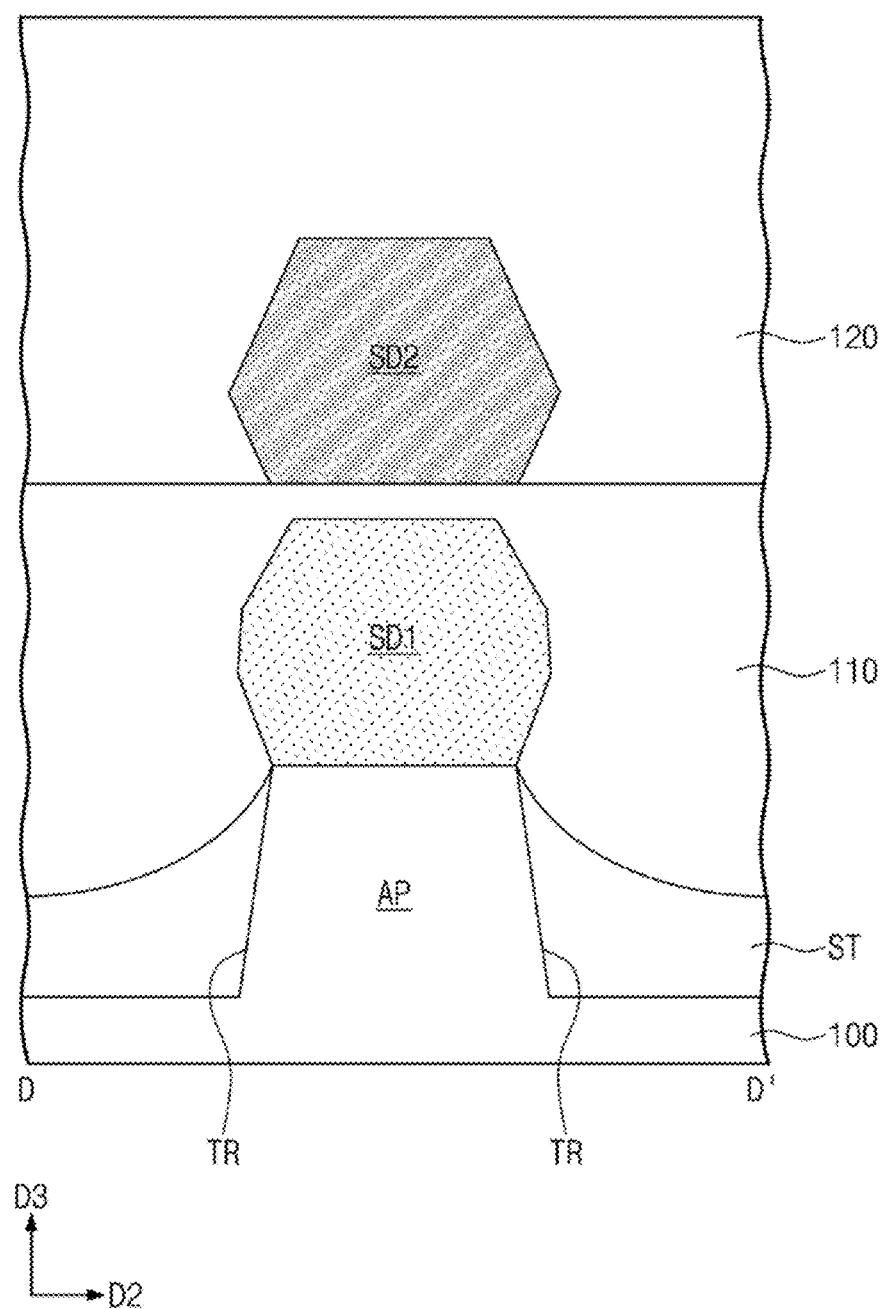

Referring to FIGS. 21A and 21B, second source/drain patterns SD2 may be formed on a top surface of the first interlayer dielectric layer 110. For example, a second SEG process may be performed in which the sidewalls of the upper semiconductor patterns USP are used as seeds, and thus a first semiconductor section may be formed to cover the sidewalls of the upper semiconductor patterns. The first semiconductor section may include a semiconductor element (e.g., SiGe) whose lattice constant is greater than that of a semiconductor element of the substrate 100. The first semiconductor section may contain germanium (Ge) whose concentration is relatively low. According to some example embodiments, the first semiconductor section may include silicon (Si), but may not include germanium (Ge). A concentration of germanium (Ge) contained in the first semiconductor section may range from about 0 at % to about 10 at %.

The first semiconductor section may undergo a third SEG process to form a second semiconductor section. The second semiconductor section may contain germanium (Ge) whose concentration is relatively high. For example, a concentration of germanium (Ge) contained in the second semiconductor section may range from about 30 at % to about 70 at %. The first semiconductor section and the second semiconductor section may constitute the second source/drain pattern SD2. According to some example embodiments, impurities may be in-situ implanted during the second and third SEG processes. According to some example embodiments, after the second source/drain pattern SD2 is formed, impurities may be implanted into the second source/drain pattern SD2. The second source/drain pattern SD2 may be doped have a second conductivity type (e.g., p-type).

Referring to FIGS. 20A, 21A, and 21B, a second interlayer dielectric layer 120 may be formed to cover the second source/drain patterns SD2 and the gate spacers GS. For example, the second interlayer dielectric layer 120 may include a silicon oxide layer. The second interlayer dielectric layer 120 may be planarized until top surfaces of the sacrificial patterns PP are exposed. An etch-back or chemical mechanical polishing (CMP) process may be employed to planarize the second interlayer dielectric layer 120. The hardmask patterns MP may all be removed during the planarization process. As a result, the second interlayer dielectric layer 120 may have a top surface coplanar with those of the sacrificial patterns PP and those of the gate spacers GS.

An etch process may be used to selectively remove the sacrificial patterns PP, the first sacrificial layers SAL1, and the second sacrificial layers SAL2. The etching process may be a wet etching process. An etching material used in the etching process may remove both of the first ion implantation pattern IDP1 and the second ion implantation pattern IDP2 each of which has a relatively high concentration of germanium. The sacrificial patterns PP, the first sacrificial layers SAL1, the second sacrificial layers SAL2, the first ion implantation pattern IDP1, and the second ion implantation pattern IDP2 may be removed to form empty spaces ES. The empty space ES, which is formed by the removal of the first ion implantation pattern IDP1 and the first sacrificial layers SAL1 on the top and bottom surfaces of the first ion implantation pattern IDP1, may be larger than the empty spaces ES between two neighboring upper semiconductor patterns USP. In addition, the empty space ES, which is formed by the removal of the second ion implantation pattern IDP2 and the second sacrificial layers SAL2 on the top and bottom surfaces of the second ion implantation pattern IDP2, may be larger than the empty spaces ES between two neighboring lower semiconductor patterns LSP.

Referring to FIGS. 2A to 2C, a gate dielectric layer GI may be conformally formed in the empty spaces ES. A gate electrode GE may be formed on the gate dielectric layer GI. The gate electrode GE may be formed to fill the empty spaces ES. According to some example embodiments, the formation of the gate electrode GE may include forming a first metal pattern in the empty spaces ES and forming a second metal pattern to fill unoccupied portions of the empty spaces ES. The first metal pattern may include a plurality of stacked work-function metal layers. The second metal pattern may include metal whose resistance is less than that of the first metal pattern. Afterwards, a gate capping pattern GP may be formed on the gate electrode GE.

According to some example embodiments of the present inventive concepts, each of channel structures on an active pattern may include semiconductor layers whose number is variously changed, and each of the channel structures may have a bottom surface whose level is changed depending on the number of the semiconductor layers included in the channel structure. Therefore, a semiconductor device may increase in electrical properties and decrease in operating voltage, which may improve electrical properties of the semiconductor device, reliability of the semiconductor device, or the like.

Although some example embodiments of inventive concepts have been discussed with reference to accompanying figures, it will be understood that various changes in form and details may be made therein without departing from the spirit and scope of inventive concepts. It therefore will be understood that the example embodiments described above are just illustrative but not limitative in all aspects.

What is claimed is:

1. A semiconductor device, comprising:
an active pattern on a substrate;
a pair of first source/drain patterns on the active pattern;
a pair of second source/drain patterns on top surfaces of the pair of first source/drain patterns;
a gate electrode that extends across the active pattern, the gate electrode having sidewalls that face the pair of first source/drain patterns and the pair of second source/drain patterns;
a first channel structure that extends across the gate electrode and connects the pair of first source/drain patterns to each other;
a second channel structure that extends across the gate electrode and connects the pair of second source/drain patterns to each other; and
a gate dielectric layer between the gate electrode and the first channel structure, between the gate electrode and the active pattern, and between the gate electrode and the second channel structure,
wherein the gate electrode includes
a first lower part that is entirely below a bottom surface of the first channel structure, the first lower part between the bottom surface of the first channel structure and a top surface of the active pattern and further between immediately-adjacent first opposing gate dielectric layer surfaces of the gate dielectric layer, and
a first upper part between a top surface of the first channel structure and a bottom surface of the second channel structure and further between immediately-adjacent second opposing gate dielectric layer surfaces of the gate dielectric layer,
wherein the first lower part has a thickness between the immediately-adjacent first opposing gate dielectric layer surfaces, the thickness of the first lower part greater than a thickness of the first upper part between the immediately-adjacent second opposing gate dielectric layer surfaces.

2. The semiconductor device of claim 1, wherein
the second channel structure includes a plurality of upper semiconductor patterns that are vertically stacked, and
the first channel structure includes one or more lower semiconductor patterns, wherein a quantity of the one or more lower semiconductor patterns is less than a quantity of the plurality of upper semiconductor patterns.

3. The semiconductor device of claim 1, wherein
the first channel structure includes
a first lower semiconductor pattern on a top surface of the first lower part; and
a second lower semiconductor pattern on a top surface of the first lower semiconductor pattern, and
the gate electrode further includes a second lower part between the first lower semiconductor pattern and the second lower semiconductor pattern, the second lower part having a thickness less than the thickness of the first lower part.

4. The semiconductor device of claim 1, wherein the first upper part has a top surface at a level higher than a level of bottom surfaces of the pair of second source/drain patterns.

5. The semiconductor device of claim 1, wherein a bottom surface of the first lower part is at a level higher than a level of bottom surfaces of the pair of first source/drain patterns.

6. The semiconductor device of claim 1, further comprising:
a lower inner spacer on a lateral surface of the first lower part; and
an upper inner spacer on a lateral surface of the first upper part,
wherein the lower inner spacer has a vertical length greater than a vertical length of the upper inner spacer.

7. The semiconductor device of claim 1, wherein the first lower part is electrically connected to the first upper part.

8. The semiconductor device of claim 1, wherein
the second channel structure includes
a first upper semiconductor pattern on a top surface of the first upper part, and
a second upper semiconductor pattern on a top surface of the first upper semiconductor pattern, and
the gate electrode further includes a second upper part between the first upper semiconductor pattern and the second upper semiconductor pattern, the second upper part having a thickness less than the thickness of the first upper part.

9. The semiconductor device of claim 1, further comprising a separation dielectric pattern between the first channel structure and the second channel structure,
wherein the separation dielectric pattern has a bottom surface at a level lower than a level of the top surfaces of the pair of first source/drain patterns.

10. The semiconductor device of claim 1, further comprising a separation dielectric pattern between the first channel structure and the second channel structure,
wherein the separation dielectric pattern has a top surface at a level higher than a level of bottom surfaces of the pair of second source/drain patterns.

11. A semiconductor device, comprising:
an active pattern that extends in a first direction on a substrate, the first direction being parallel to a top surface of the substrate or a bottom surface of the substrate;
a pair of first source/drain patterns on the active pattern;
a first channel structure including at least one lower semiconductor pattern that connects the pair of first source/drain patterns to each other;
a first interlayer dielectric layer on the pair of first source/drain patterns;
a pair of second source/drain patterns on the first interlayer dielectric layer, the pair of second source/drain patterns vertically overlapping the pair of first source/drain patterns;
a second channel structure including a plurality of upper semiconductor patterns that connect the pair of second source/drain patterns to each other;
a second interlayer dielectric layer on the pair of second source/drain patterns;
a gate electrode that extends across the first channel structure and the second channel structure, the gate electrode extending in a second direction that intersects the first direction;
a plurality of gate spacers on sidewalls of the gate electrode;
a gate capping pattern that covers a top surface of the gate electrode between the plurality of gate spacers;
a plurality of inner spacers between the gate electrode and the pair of first source/drain patterns; and
a gate dielectric layer between the gate electrode and the first channel structure, between the gate electrode and the active pattern, and between the gate electrode and the second channel structure, wherein the gate electrode includes
- a first lower part that is entirely below a bottom surface of the first channel structure, the first lower part between the bottom surface of the first channel structure and a top surface of the active pattern and further between immediately-adjacent first opposing gate dielectric layer surfaces of the gate dielectric layer, and
- a first upper part between a top surface of the first channel structure and a bottom surface of the second channel structure and further between immediately-adjacent second opposing gate dielectric layer surfaces of the gate dielectric layer, wherein the first lower part has a thickness between the immediately-adjacent first opposing gate dielectric layer surfaces, the thickness of the first lower part greater than a thickness of the first upper part between the immediately-adjacent second opposing gate dielectric layer surfaces.

12. The semiconductor device of claim 11, wherein the first upper part has a top surface at a level higher than a level of bottom surfaces of the pair of second source/drain patterns.

13. The semiconductor device of claim 11, wherein the first channel structure includes
- a first lower semiconductor pattern on a top surface of the first lower part, and
- a second lower semiconductor pattern on a top surface of the first lower semiconductor pattern, and the gate electrode further includes a second lower part between the first lower semiconductor pattern and the second lower semiconductor pattern, the second lower part having a thickness less than the thickness of the first lower part.

14. The semiconductor device of claim 11, wherein the first lower part is electrically connected to the first upper part.

15. The semiconductor device of claim 11, wherein the thickness of the first lower part is greater than a width in the first direction of the first lower part.

* * * * *